United States Patent
Doyle et al.

(10) Patent No.: US 9,501,174 B2
(45) Date of Patent: Nov. 22, 2016

(54) TEMPERATURE SENSING DISPLAY ASSEMBLIES

(71) Applicant: APPLE INC., Cupertino, CA (US)

(72) Inventors: David A. Doyle, San Francisco, CA (US); Joshua G. Wurzel, Campbell, CA (US); Tyler R. Kakuda, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 54 days.

(21) Appl. No.: 14/683,806

(22) Filed: Apr. 10, 2015

(65) Prior Publication Data

US 2016/0299629 A1 Oct. 13, 2016

(51) Int. Cl.
*G06F 3/041* (2006.01)
*G02F 1/1333* (2006.01)
*G02F 1/1335* (2006.01)

(52) U.S. Cl.
CPC ........... *G06F 3/0418* (2013.01); *G02F 1/1336* (2013.01); *G02F 1/13338* (2013.01); *G06F 3/0412* (2013.01)

(58) Field of Classification Search
CPC ............... G06F 3/0418; G06F 3/0412; G02F 1/13338; G02F 1/1336; G02F 1/133603
See application file for complete search history.

(56) References Cited

U.S. PATENT DOCUMENTS

| | | | | |
|---|---|---|---|---|
| 2007/0007539 A1* | 1/2007 | Kim | ................. | G02F 1/133603 257/88 |
| 2007/0211182 A1* | 9/2007 | Erchak | ................. | G02B 6/0085 349/1 |
| 2007/0211183 A1* | 9/2007 | Erchak | ................. | G02B 6/0085 349/1 |
| 2007/0211184 A1* | 9/2007 | Erchak | ................. | G02B 6/0068 349/1 |
| 2014/0071372 A1* | 3/2014 | Li | ......................... | F21V 29/002 349/58 |

OTHER PUBLICATIONS

Chonko, "Use Forward Voltage Drop to Measure Junction Temperature." Dec. 15, 2005, 5 pages, http://electronicdesign.com/lighting/use-forward-voltage-drop-measure-junction-temperature.
Karha et al., "Relationships Between Junction Temperature, Forward Voltage and Spectrum of LEDs." Apr. 6, 2013, pp. 1-14, http://www.m4ssl.npl.co.uk/wp-content/uploads/2013/01/Petri-Kaha-RELATIONSHIPS-BETWEEN-JUNCTION-TEMPERATURE.pdf.
Zabiliute, "Temperature Characteristics of LEDs." 2013, pp. 1-10, http://web.vu.lt/tmi/a.zabiliute/wp-content/uploads/sites/2/2013/11/LED_Temperature_characterstics.pdf.

* cited by examiner

*Primary Examiner* — Tom Sheng
(74) *Attorney, Agent, or Firm* — Van Court & Aldridge LLP

(57) ABSTRACT

Systems, methods, and computer-readable media for determining the temperature of a light-generating component of a display assembly using a voltage of the light-generating component are provided. In one embodiment, a method for operating an electronic device, which may include an external surface and a light-emitting diode operative to emit light for illuminating the external surface, may include detecting the forward voltage of the light-emitting diode, calculating the temperature of the light-emitting diode using the detected forward voltage of the light-emitting diode, and altering the performance of the electronic device based on the calculated temperature of the light-emitting diode. Additional embodiments are also provided.

28 Claims, 13 Drawing Sheets

CALCULATING THE TEMPERATURE OF A PORTION OF AN EXTERNAL SURFACE OF AN ELECTRONIC DEVICE USING A FORWARD VOLTAGE OF A LIGHT-EMITTING DIODE THAT IS OPERATIVE TO EMIT LIGHT THROUGH THE EXTERNAL SURFACE
502

↓

ALTERING THE PERFORMANCE OF THE ELECTRONIC DEVICE BASED ON THE CALCULATED TEMPERATURE OF THE PORTION OF AN EXTERNAL SURFACE
504

500
FIG. 5

CALCULATING A TEMPERATURE OF EACH PORTION OF A NUMBER OF PORTIONS OF AN EXTERNAL SURFACE OF AN ELECTRONIC DEVICE USING A FORWARD VOLTAGE OF A RESPECTIVE LIGHT-EMITTING DIODE OF A NUMBER OF LIGHT-EMITTING DIODES THAT IS OPERATIVE TO EMIT LIGHT THROUGH THE EXTERNAL SURFACE
602

DETERMINING A POSITION OF A TOUCH EVENT ON THE EXTERNAL SURFACE USING THE CALCULATED TEMPERATURES
604

600
FIG. 6

TEMPERATURE SENSING DISPLAY ASSEMBLIES

TECHNICAL FIELD

This disclosure relates to temperature sensing display assemblies and, more particularly, to temperature sensing display assemblies that leverage the forward voltage of a light-generating component.

BACKGROUND OF THE DISCLOSURE

An electronic device (e.g., a laptop computer, a cellular telephone, etc.) may be provided with a display assembly that consumes a majority of an external device surface. However, heretofore, such display assemblies have prevented adequate temperature sensing along such an external device surface.

SUMMARY OF THE DISCLOSURE

This document describes systems, methods, and computer-readable media for determining the temperature of a light-generating component of a display assembly using a voltage of the light-generating component.

For example, an electronic device may include a display assembly that includes an external display surface, a light-emitting diode operative to emit light for illuminating the external display surface, and a component stack extending between the light-emitting diode and a portion of the external display surface, wherein the component stack provides a thermal resistance between the light-emitting diode and the portion of the external display surface. The electronic device may also include a sensor management system operative to access a correlator that defines a relationship between the forward voltage of the light-emitting diode and the temperature of the light-emitting diode, access the value of the thermal resistance of the component stack between the light-emitting diode and the portion of the external display surface, detect the current forward voltage of the light-emitting diode, determine the current temperature of the light-emitting diode based on the detected current forward voltage of the light-emitting diode and based on the accessed correlator, and determine the current temperature of the portion of the external display surface based on the determined current temperature of the light-emitting diode and based on the accessed value of the thermal resistance of the component stack between the light-emitting diode and the portion of the external display surface.

As another example, a method for operating an electronic device that includes an external surface, a light-emitting component operative to emit light for illuminating the external surface, and a component stack extending between the light-emitting component and a portion of the external surface, wherein the component stack provides a thermal resistance between the light-emitting component and the portion of the external surface, may include accessing, with the electronic device, a correlator that defines a relationship between the forward voltage of the light-emitting component and the temperature of the light-emitting component, retrieving, with the electronic device, the value of the thermal resistance of the component stack between the light-emitting component and the portion of the external surface, detecting, with the electronic device, the current forward voltage of the light-emitting component, determining, with the electronic device, the current temperature of the light-emitting component based on the detected current forward voltage of the light-emitting component and based on the accessed correlator, determining, with the electronic device, the current temperature of the portion of the external surface based on the determined current temperature of the light-emitting component and based on the retrieved value of the thermal resistance of the component stack between the light-emitting component and the portion of the external surface, and adjusting, with the electronic device, a function of the electronic device based on the determined current temperature of the portion of the external surface.

As yet another example, a non-transitory computer-readable medium for controlling an electronic device that includes an external surface, a light-emitting component operative to emit light for illuminating the external surface, and a component stack extending between the light-emitting component and a portion of the external surface, wherein the component stack provides a thermal resistance between the light-emitting component and the portion of the external surface, may include computer-readable instructions recorded thereon for accessing, with the electronic device, a correlator that defines a relationship between the forward voltage of the light-emitting component and the temperature of the light-emitting component, retrieving, with the electronic device, the value of the thermal resistance of the component stack between the light-emitting component and the portion of the external surface, detecting, with the electronic device, the current forward voltage of the light-emitting component, determining, with the electronic device, the current temperature of the light-emitting component based on the detected current forward voltage of the light-emitting component and based on the accessed correlator, determining, with the electronic device, the current temperature of the portion of the external surface based on the determined current temperature of the light-emitting component and based on the retrieved value of the thermal resistance of the component stack between the light-emitting component and the portion of the external surface, and adjusting, with the electronic device, a functionality of the electronic device based on the determined current temperature of the portion of the external surface.

As yet another example, an electronic device may include an output assembly including an external surface and a light-emitting diode operative to emit light through the external surface. The electronic device may also include a sensor management system operative to access a correlator that defines a relationship between the forward voltage of the light-emitting diode and the temperature of the light-emitting diode, detect the current forward voltage of the light-emitting diode, determine the current temperature of the light-emitting diode based on the detected current forward voltage of the light-emitting diode and based on the accessed correlator, and adjust a functionality of the electronic device based on the determined current temperature of the light-emitting diode.

As yet another example, a method for operating an electronic device that includes an external surface and a light-emitting diode operative to emit light for illuminating the external surface may include detecting the forward voltage of the light-emitting diode, calculating the temperature of the light-emitting diode using the detected forward voltage of the light-emitting diode, and altering the performance of the electronic device based on the calculated temperature of the light-emitting diode.

As yet another example, a method for operating an electronic device that includes an external surface and a light-emitting diode operative to emit light through the external surface may include calculating the temperature of a portion of the external surface using a forward voltage of the light-emitting diode, and altering the performance of the electronic device based on the calculated temperature of the portion of the external surface.

As yet another example, a method for operating an electronic device that includes an external surface and a number of light-emitting diodes operative to emit light through the external surface may include calculating a temperature of each portion of a number of portions of the external surface using a forward voltage of a respective light-emitting diode of the number of light-emitting diodes, and determining a position of a touch event on the external surface using the calculated temperatures.

This Summary is provided merely to summarize some example embodiments, so as to provide a basic understanding of some aspects of the subject matter described in this document. Accordingly, it will be appreciated that the features described in this Summary are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The discussion below makes reference to the following drawings, in which like reference characters may refer to like parts throughout, and in which:

FIGS. 3-6 are flowcharts of illustrative processes for determining the temperature of a light-generating component of a display assembly.

DETAILED DESCRIPTION OF THE DISCLOSURE

Systems, methods, and computer-readable media may be provided for determining the temperature of a light-generating component of a display assembly using a voltage of the light-generating component. A display assembly of an electronic device may include one or more light-generating components for emitting light through an external surface of the electronic device. A system component stack of a display assembly often prevents the effective positioning of a dedicated temperature sensor at or near the external surface, thereby reducing the number of positions within the device at which the device temperature may be accurately sensed. However, a forward voltage of one or more light-generating components of a display assembly may be dependent or otherwise correlate with the temperature of the light-generating component, such that detection of the forward voltage of such light-generating components may enable determination of the temperature at one or more locations of the display assembly. A display assembly with multiple light-generating components may be effectively leveraged as a temperature sensing assembly for the external surface of the device by exploiting the thermal dependence of the light-generating components' forward voltage. In some embodiments, the position of a touch event on the external surface and/or the temperature of an object external to the device may be determined by such a temperature sensing display assembly. Any suitable functionality of the electronic device may be adjusted in any suitable manner based on any determined temperature of a display assembly of the electronic device.

Figure 1:
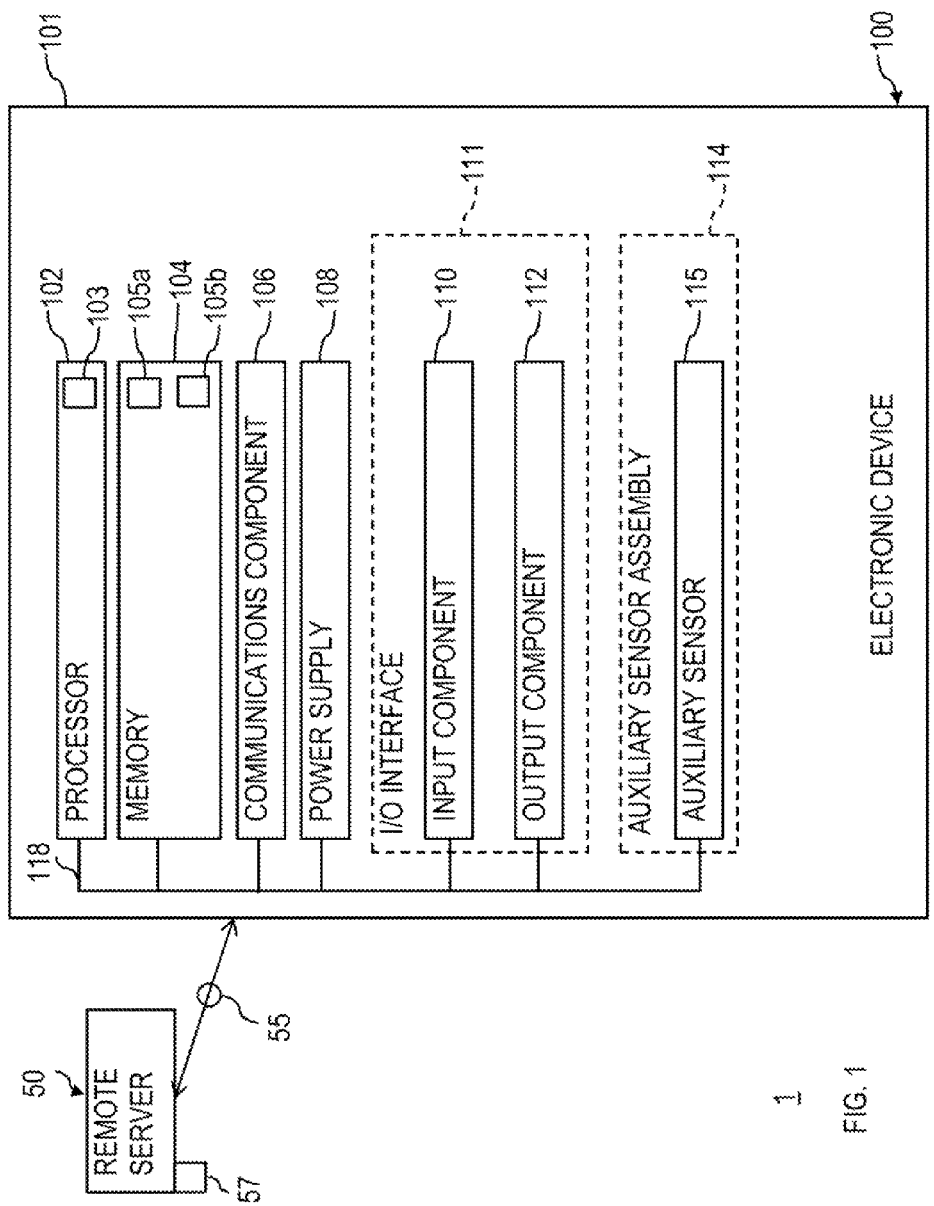
FIG. 1 is a schematic view of an illustrative system including an electronic device with a temperature sensing display assembly.
Figure 1A:
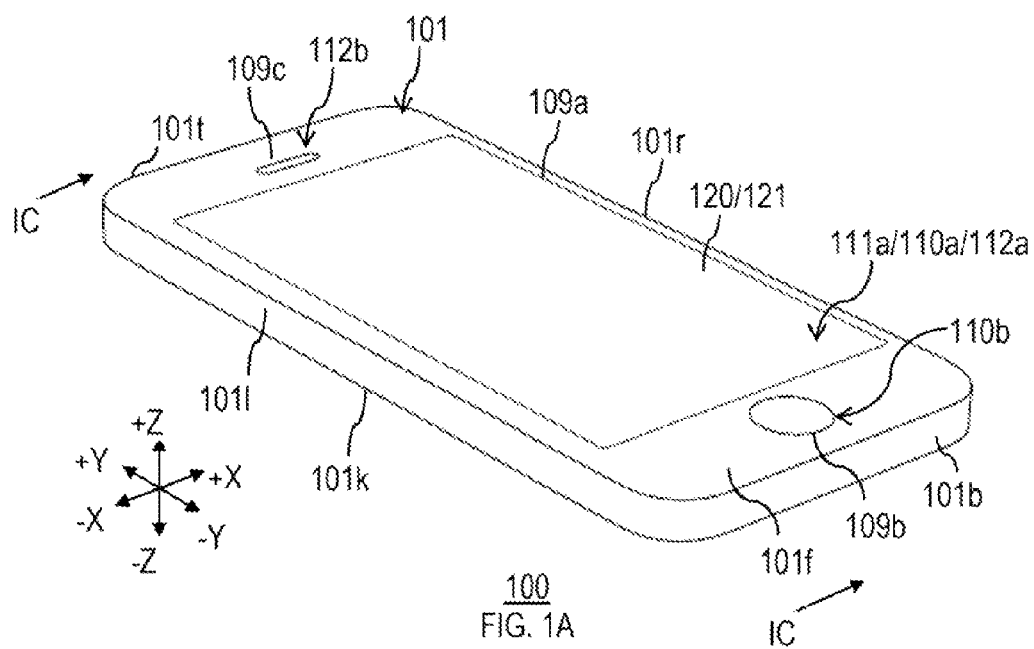
FIG. 1A is a front, left, bottom perspective view of the electronic device of FIG. 1, in accordance with some embodiments.
Figure 1B:
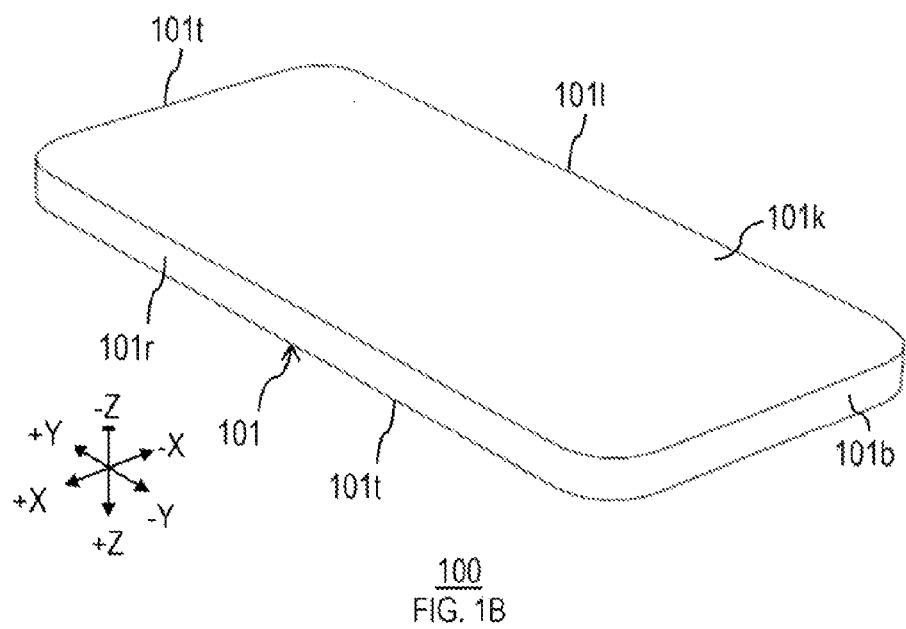
FIG. 1B is a back, right, bottom perspective view of the electronic device of FIGS. 1 and 1A, in accordance with some embodiments.

FIG. 1 is a schematic view of a system 1 with an illustrative electronic device 100 that may include a temperature sensing display assembly. Electronic device 100 can include, but is not limited to, a music player (e.g., an iPod™ available by Apple Inc. of Cupertino, Calif.), video player, still image player, game player, other media player, music recorder, movie or video camera or recorder, still camera, other media recorder, radio, medical equipment, domestic appliance, transportation vehicle instrument, musical instrument, calculator, cellular telephone (e.g., an iPhone™ available by Apple Inc.), other wireless communication device, personal digital assistant, remote control, pager, computer (e.g., a desktop (e.g., an iMac™ available by Apple Inc.), laptop (e.g., a MacBook™ available by Apple Inc.), tablet (e.g., an iPad™ available by Apple Inc.), server, etc.), monitor, television, stereo equipment, set up box, set-top box, boom box, modem, router, printer, or any combination thereof. In some embodiments, electronic device 100 may perform a single function (e.g., a device dedicated to sensing the temperature of its display assembly) and, in other embodiments, electronic device 100 may perform multiple functions (e.g., a device that senses the temperature of its display assembly, plays music, and receives and transmits telephone calls).

Electronic device 100 may be any portable, mobile, hand-held, or miniature electronic device that may be configured to sense the temperature of its display assembly wherever a user travels. Some miniature electronic devices may have a form factor that is smaller than that of hand-held electronic devices, such as an iPod™. Illustrative miniature electronic devices can be integrated into various objects that may include, but are not limited to, watches (e.g., an Apple Watch™ available by Apple Inc.), rings, necklaces, belts, accessories for belts, headsets, accessories for shoes, virtual reality devices, glasses, other wearable electronics, accessories for sporting equipment, accessories for fitness equipment, key chains, or any combination thereof. Alternatively, electronic device 100 may not be portable at all, but may instead be generally stationary.

As shown in FIG. 1, for example, electronic device 100 may include a processor 102, memory 104, a communications component 106, a power supply 108, an input component 110, an output component 112, and a sensor assembly 114. Electronic device 100 may also include a bus 118 that may provide one or more wired or wireless communication links or paths for transferring data and/or power to, from, or between various other components of device 100. In some embodiments, one or more components of electronic device 100 may be combined or omitted. Moreover, electronic device 100 may include any other suitable components not combined or included in FIG. 1 and/or several instances of the components shown in FIG. 1. For the sake of simplicity, only one of each of the components is shown in FIG. 1.

Memory 104 may include one or more storage mediums, including for example, a hard-drive, flash memory, permanent memory such as read-only memory ("ROM"), semi-permanent memory such as random access memory ("RAM"), any other suitable type of storage component, or any combination thereof. Memory 104 may include cache memory, which may be one or more different types of memory used for temporarily storing data for electronic device applications. Memory 104 may be fixedly embedded within electronic device 100 or may be incorporated onto one or more suitable types of components that may be repeatedly inserted into and removed from electronic device 100 (e.g., a subscriber identity module ("SIM") card or secure digital ("SD") memory card). Memory 104 may store media data (e.g., music and image files), software (e.g., for implementing functions on device 100), firmware, preference information (e.g., media playback preferences), lifestyle information (e.g., food preferences), exercise information (e.g., information obtained by exercise monitoring equipment), transaction information (e.g., credit card information), wireless connection information (e.g., information that may enable device 100 to establish a wireless connection), subscription information (e.g., information that keeps track of podcasts or television shows or other media a user subscribes to), contact information (e.g., telephone numbers and e-mail addresses), calendar information, pass information (e.g., transportation boarding passes, event tickets, coupons, store cards, financial payment cards, etc.), any suitable forward voltage-temperature correlator data of any light-generating component of a display assembly of device 100 (e.g., as may be stored in a correlator memory portion 105a of memory 104), any suitable thermal resistance data of any component stack of device 100 (e.g., as may be stored in a thermal resistance memory portion 105b of memory 104), any other suitable data, or any combination thereof.

Communications component 106 may be provided to allow device 100 to communicate with one or more other electronic devices or servers of system 1 (e.g., data source or server 50, as may be described below) using any suitable communications protocol. For example, communications component 106 may support Wi-Fi™ (e.g., an 802.11 protocol), ZigBee™ (e.g., an 802.15.4 protocol), WiDi™, Ethernet, Bluetooth™, Bluetooth™ Low Energy ("BLE"), high frequency systems (e.g., 900 MHz, 2.4 GHz, and 5.6 GHz communication systems), infrared, transmission control protocol/internet protocol ("TCP/IP") (e.g., any of the protocols used in each of the TCP/IP layers), Stream Control Transmission Protocol ("SCTP"), Dynamic Host Configuration Protocol ("DHCP"), hypertext transfer protocol ("HTTP"), BitTorrent™, file transfer protocol ("FTP"), real-time transport protocol ("RTP"), real-time streaming protocol ("RTSP"), real-time control protocol ("RTCP"), Remote Audio Output Protocol ("RAOP"), Real Data Transport Protocol™ ("RDTP"), User Datagram Protocol ("UDP"), secure shell protocol ("SSH"), wireless distribution system ("WDS") bridging, any communications protocol that may be used by wireless and cellular telephones and personal e-mail devices (e.g., Global System for Mobile Communications ("GSM"), GSM plus Enhanced Data rates for GSM Evolution ("EDGE"), Code Division Multiple Access ("CDMA"), Orthogonal Frequency-Division Multiple Access ("OFDMA"), high speed packet access ("HSPA"), multi-band, etc.), any communications protocol that may be used by a low power Wireless Personal Area Network ("6LoWPAN") module, any other communications protocol, or any combination thereof. Communications component 106 may also include or may be electrically coupled to any suitable transceiver circuitry that can enable device 100 to be communicatively coupled to another device (e.g., a server, host computer, scanner, accessory device, etc.), such as server 50, and communicate data 55 with that other device wirelessly, or via a wired connection (e.g., using a connector port). Communications component 106 may be configured to determine a geographical position of electronic device 100 and/or any suitable data that may be associated with that position. For example, communications component 106 may utilize a global positioning system ("GPS") or a regional or site-wide positioning system that may use cell tower positioning technology or Wi-Fi™ technology, or any suitable location-based service or real-time locating system, which may leverage a geo-fence for providing any suitable location-based data to device 100. As described below in more detail, system 1 may include any suitable remote entity or data source, such as server 50, that may be configured to communicate any suitable data 55 with electronic device 100 (e.g., via communications component 106) using any suitable communications protocol and/or any suitable communications medium.

Power supply 108 may include any suitable circuitry for receiving and/or generating power, and for providing such power to one or more of the other components of electronic device 100. For example, power supply 108 can be coupled to a power grid (e.g., when device 100 is not acting as a portable device or when a battery of the device is being charged at an electrical outlet with power generated by an electrical power plant). As another example, power supply 108 may be configured to generate power from a natural source (e.g., solar power using solar cells). As another example, power supply 108 can include one or more batteries for providing power (e.g., when device 100 is acting as a portable device). For example, power supply 108 can include one or more of a battery (e.g., a gel, nickel metal hydride, nickel cadmium, nickel hydrogen, lead acid, or lithium-ion battery), an uninterruptible or continuous power supply ("UPS" or "CPS"), and circuitry for processing power received from a power generation source (e.g., power generated by an electrical power plant and delivered to the user via an electrical socket or otherwise). The power can be provided by power supply 108 as alternating current or direct current, and may be processed to transform power or limit received power to particular characteristics. For example, the power can be transformed to or from direct current, and constrained to one or more values of average power, effective power, peak power, energy per pulse, voltage, current (e.g., measured in amperes), or any other characteristic of received power. Power supply 108 can be operative to request or provide particular amounts of power at different times, for example, based on the needs or requirements of electronic device 100 or periphery devices that may be coupled to electronic device 100 (e.g., to request more power when charging a battery than when the battery is already charged).

One or more input components 110 may be provided to permit a user or device environment to interact or interface with device 100. For example, input component 110 can take a variety of forms, including, but not limited to, a touch pad, dial, click wheel, scroll wheel, touch screen, one or more buttons (e.g., a keyboard), mouse, joy stick, track ball, microphone, camera, scanner (e.g., a barcode scanner or any other suitable scanner that may obtain product identifying information from a code, such as a linear barcode, a matrix barcode (e.g., a quick response ("QR") code), or the like), proximity sensor, light detector, biometric sensor (e.g., a fingerprint reader or other feature recognition sensor, which may operate in conjunction with a feature-processing application that may be accessible to electronic device 100 for authenticating a user), line-in connector for data and/or power, and combinations thereof. Each input component 110 can be configured to provide one or more dedicated control functions for making selections or issuing commands associated with operating device 100.

Electronic device 100 may also include one or more output components 112 that may present information (e.g., graphical, audible, and/or tactile information) to a user of device 100. For example, output component 112 of electronic device 100 may take various forms, including, but not limited to, audio speakers, headphones, line-out connectors for data and/or power, visual displays (e.g., for transmitting data via visible light and/or via invisible light), infrared ports, flashes (e.g., light sources for providing artificial light for illuminating an environment of the device), tactile/haptic outputs (e.g., rumblers, vibrators, etc.), and combinations thereof. As a specific example, electronic device 100 may include a display assembly output component as output component 112, where such a display assembly output component may include any suitable type of display or interface for presenting visual data to a user with visible light. A display assembly output component may include a display embedded in device 100 or coupled to device 100 (e.g., a removable display). A display assembly output component may include, for example, a liquid crystal display ("LCD"), which may include any suitable backlight or other light source that may or may not use one or any other suitable number of light emitting diodes ("LEDs"), a light emitting diode ("LED") display, a plasma display, an organic light-emitting diode ("OLED") display, a micro-LED display, a nano-LED display, a surface-conduction electron-emitter display ("SED"), a carbon nanotube display, a nanocrystal display, any other suitable type of display, or combination thereof. Alternatively, a display assembly output component can include a movable display or a projecting system for providing a display of content on a surface remote from electronic device 100, such as, for example, a video projector, a head-up display, or a three-dimensional (e.g., holographic) display. As another example, a display assembly output component may include a digital or mechanical viewfinder, such as a viewfinder of the type found in compact digital cameras, reflex cameras, or any other suitable still or video camera. A display assembly output component may include display driver circuitry, circuitry for driving display drivers, or both, and such a display assembly output component can be operative to display content (e.g., media playback information, application screens for applications implemented on electronic device 100, information regarding ongoing communications operations, information regarding incoming communications requests, device operation screens, etc.) that may be under the direction of processor 102. In some embodiments, a display assembly output component may include a single or only a few light sources (e.g., one or a few LEDs) that may provide sufficient light for enabling a multi-pixel display and/or that may provide a single display object (e.g., an illuminated logo or status light) when a single light source shines through a light-transmissive portion of housing 101 of device 100.

It should be noted that one or more input components and one or more output components may sometimes be referred to collectively herein as an input/output ("I/O") component or I/O interface (e.g., input component 110 and output component 112 as I/O component or I/O interface 111). For example, input component 110 and output component 112 may sometimes be a single I/O interface 111, such as a touch screen, that may receive input information through a user's touch of a display screen and that may also provide visual information to a user via that same display screen.

Moreover, auxiliary sensor assembly 114 may include one or more auxiliary sensors 115 that can be provided to detect one or more auxiliary characteristics related to a current operation, performance, or environmental condition of one or more electronic components or areas of electronic device 100, where such a detected characteristic may be utilized for at least partially controlling a functionality of electronic device 100, such as the thermal management of electronic device 100 and/or biometric detection of a user of device 100 and/or detection of a user input event at electronic device 100 and/or generation of data output from electronic device 100. For example, each auxiliary sensor 115 of auxiliary sensor assembly 114 may take one of various forms, including, but not limited to, any suitable temperature sensor (e.g., thermistor, thermocouple, thermometer, silicon bandgap temperature sensor, bimetal sensor, etc.) for detecting the temperature of a portion of electronic device 100, a performance analyzer for detecting an application characteristic related to the current operation of one or more components of electronic device 100 (e.g., processor 102), one or more single-axis or multi-axis accelerometers, angular rate or inertial sensors (e.g., optical gyroscopes, vibrating gyroscopes, gas rate gyroscopes, or ring gyroscopes), magnetometers (e.g., scalar or vector magnetometers), pressure sensors, light sensors (e.g., ambient light sensors ("ALS"), infrared ("IR") sensors, etc.), linear velocity sensors, thermal sensors, microphones, proximity sensors, capacitive proximity sensors, acoustic sensors, sonic or sonar sensors, radar sensors, image sensors, video sensors, global positioning system ("GPS") detectors, radio frequency ("RF") detectors, RF or acoustic Doppler detectors, RF triangulation detectors, electrical charge sensors, peripheral device detectors, event counters, and any combinations thereof. For example, processor 102 may be configured to read data from one or more auxiliary sensors 115 of auxiliary sensor assembly 114 in order to determine the orientation or velocity of electronic device 100, and/or the amount or type of light, heat, or sound that device 100 is being exposed to, the load or amount of power being used by one or more components of device 100, and the like. In some embodiments, auxiliary sensor assembly 114 may include at least two auxiliary sensor components 115, such as a first temperature sensor and a second temperature sensor, where the two or more sensor components 115 of auxiliary sensor assembly 114 may be leveraged together by device 100 to measure one or more particular properties of device 100 in a more efficient or otherwise improved manner than may be possible by leveraging only a single one of such sensor components to do such measuring. Each sensor component 115 of auxiliary sensor assembly 114 may be positioned at any suitable location at least partially within or on an external surface of a housing 101 of device 100. Electronic device 100 may be configured to leverage data (e.g., temperature data) detected by one or more sensor components 115 (e.g., one or more of sensor components 115a-115e of FIG. 1C) of auxiliary sensor assembly 114 together with temperature data determined from a display output component 112 to provide robust and intelligent control of one or more functionalities of electronic device 100 (e.g., to thermally manage device 100).

Processor 102 of electronic device 100 may include any processing circuitry that may be operative to control the operations and performance of one or more components of electronic device 100. For example, processor 102 may receive input signals from input component 110 and/or drive output signals through output component 112. As shown in FIG. 1, processor 102 may be used to run one or more applications, such as an application 103. Application 103 may include, but is not limited to, one or more operating system applications, firmware applications, media playback applications, media editing applications, pass applications, calendar applications, state determination applications, biometric feature-processing applications, compass applications, health applications, thermometer applications, weather applications, thermal management applications, video game applications, or any other suitable applications. For example, processor 102 may load application 103 as a user interface program to determine how instructions or data received via an input component 110 and/or any other component of device 100 (e.g., one or more sensors of auxiliary sensor assembly 114) may manipulate the one or more ways in which information may be stored and/or provided to the user via an output component 112. As another example, processor 102 may load application 103 as a background application program or a user-detectable application program (e.g., as a thermal management program (e.g., closed loop thermal management software with finite element simulation)) to determine how device characteristic data received via any suitable component and/or combination of components of device 100 (e.g., thermal or operational characteristic data from one or more sensors 115 of auxiliary sensor assembly 114 and/or thermal or operational characteristic data from display output component 112 and/or thermal or other ambient environment data from server 50) may be stored and/or otherwise used to control or manipulate at least one functionality of device 100 (e.g., a performance or mode of electronic device 100 may be altered (e.g., terminated) based on the temperature of one or more portions of device 100 (e.g., when a temperature at a certain portion of device 100 exceeds a certain threshold)). Application 103 may be accessed by processor 102 from any suitable source, such as from memory 104 (e.g., via bus 118) or from another device or server (e.g., server 50 or any other suitable remote source via communications component 106). Processor 102 may include a single processor or multiple processors. For example, processor 102 may include at least one "general purpose" microprocessor, a combination of general and special purpose microprocessors, instruction set processors, graphics processors, video processors, and/or related chips sets, and/or special purpose microprocessors. Processor 102 also may include on board memory for caching purposes.

Electronic device 100 may also be provided with a housing 101 that may at least partially enclose one or more of the components of device 100 for protection from debris and other degrading forces external to device 100. In some embodiments, one or more of the components may be provided within its own housing (e.g., input component 110 may be an independent keyboard or mouse within its own housing that may wirelessly or through a wire communicate with processor 102, which may be provided within its own housing).

FIGS. 1A-1H are various views of various portions of electronic device 100 in accordance with some embodiments. As shown, electronic device 100 may include a touch screen I/O interface 111a, which may include a touch assembly input component 110a and a display assembly output component 112a, a button assembly input component 110b, and an audio speaker assembly output component 112b, where housing 101 may be configured to at least partially enclose each of the input components and output components of device 100. Housing 101 may be any suitable shape and may include any suitable number of walls. In some embodiments, as shown in FIGS. 1A-1H, for example, housing 101 may be of a generally hexahedral shape and may include a top wall 101t, a bottom wall 101b that may be opposite top wall 101t, a left wall 101l, a right wall 101r that may be opposite left wall 101l, a front wall 101f, and a back wall 101k that may be opposite front wall 101f, where at least a portion of touch screen I/O interface 111a may be at least partially exposed to the external environment via an opening 109a through front wall 101f, where at least a portion of button assembly input component 110b may be at least partially exposed to the external environment via an opening 109b through front wall 101f, and where at least a portion of audio speaker assembly output component 112b may be at least partially exposed to the external environment via an opening 109c through front wall 101f. It is to be understood that electronic device 100 may be provided with any suitable size or shape with any suitable number and type of components other than as shown in FIGS. 1A-1H, and that the embodiments of FIGS. 1A-1H are merely exemplary.

Figure 1C:
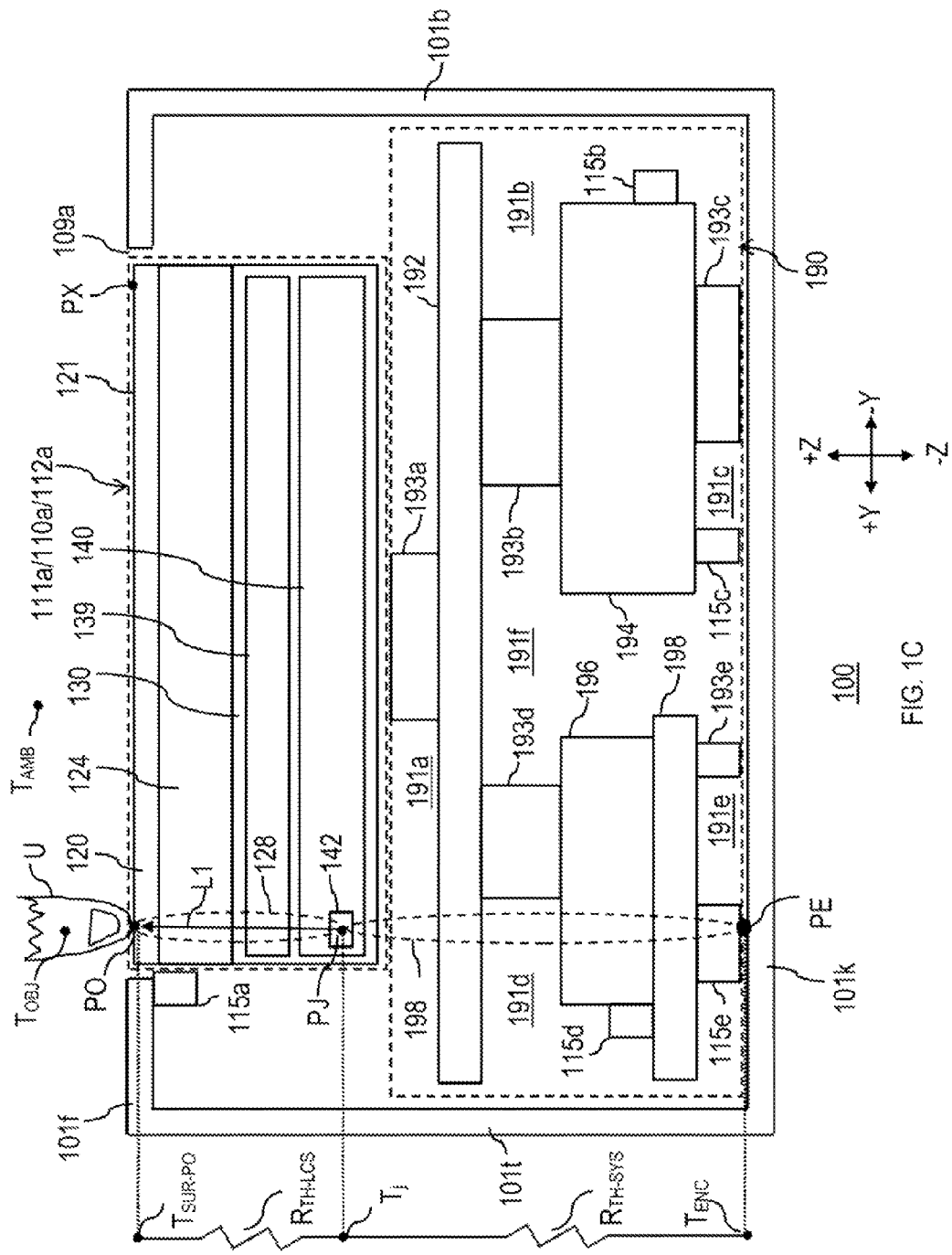
FIG. 1C is a cross-sectional view, taken from line IC-IC of FIG. 1A, of the electronic device of FIGS. 1-1B, in accordance with some embodiments.

As shown in FIG. 1C, I/O interface assembly 111a may include an external component 120 that may provide an external surface 121 that may be exposed to the external environment of electronic device 100 via housing opening 109a, such that external surface 121 may be touched or otherwise affected by a user U or any other object or element (e.g., fluid, heat, etc.) of the external environment of electronic device 100. In some embodiments, external component 120 may be a cover glass (e.g., an alkali-aluminosilicate sheet toughened glass, sapphire glass, etc.) or any other suitable material structure that may provide external surface 121 suitable for interfacing with the external environment and/or suitable for receiving light thereon and/or transmitting light therethrough for detection by user U or any other object of the external environment, where the material structure may include any suitable coating thereon (e.g., an oleophobic coating that may reduce the accumulation of fingerprints on external surface 121).

Figure 1D:
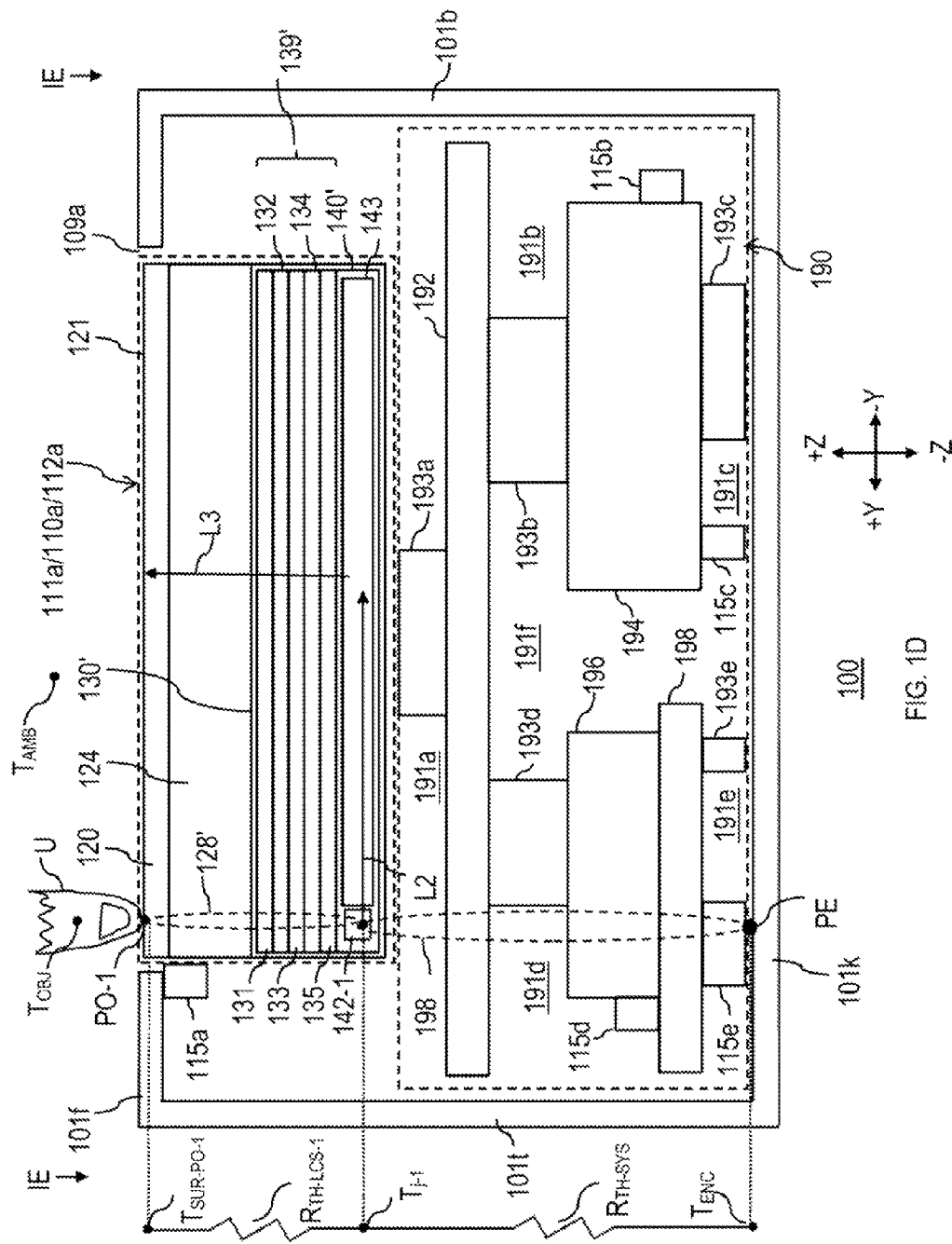
FIG. 1D is a cross-sectional view, similar to FIG. 1C, of the electronic device of FIGS. 1-1C, but with a particular display assembly, in accordance with some embodiments.
Figure 1E:
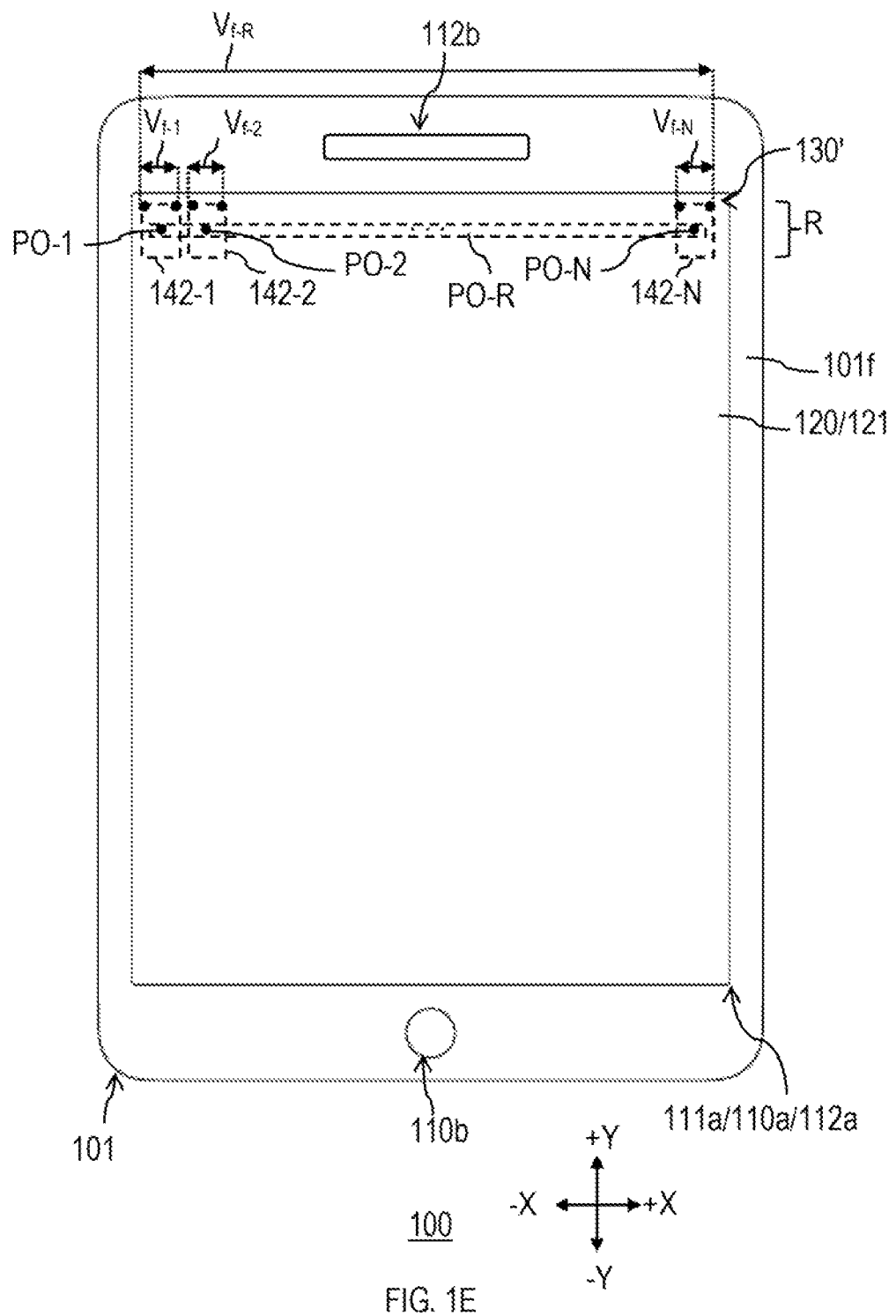
FIG. 1E is a front view, taken from line IE-IE of FIGS. 1-1D, of the electronic device of FIG. 1D, in accordance with some embodiments.

I/O interface 111 may also include a display assembly 130 underneath external component 120. Display assembly 130 may be any suitable display assembly type that may include a light-emitting subassembly 140 that may be operative to generate and emit light that may be used to selectively illuminate at least a portion of external surface 121 (e.g., along the direction of arrow L1, such as to emit light through external surface 121 and towards user U of device 100). Light-emitting subassembly 140 may include at least one light-emitting diode or any other suitable light-emitting or light-generating element or light-generating component 142 that may operate with a forward voltage or voltage drop or forward voltage drop that may correlate with a temperature of the component. Power supply 108 may be configured to provide power to each light-generating component 142 (e.g., to an LED circuit) for enabling the generation and emittance of light therefrom. In some embodiments, as shown in FIG. 1H, for example, light-generating component 142 may include any suitable light-emitting element 141 (e.g., any suitable light emitting diode D) with a first node O1 and a second node O2 across which a forward voltage $V_f$ of light-generating component 142 (e.g., of light-emitting element 141) may be measured. As shown, a current (e.g., current I) may flow through light-generating component 142 (e.g., as may be enabled by power supply 108). Moreover, in some embodiments, as shown in FIG. 1H, for example, light-generating component 142 may also include any resistance element 149 or combination of resistance elements (e.g., any suitable resistor R), which may be provided with a particular resistance (e.g., in series with light-emitting element 141, where node O2 may be between element 141 and element 149, or where element 149 may be between element 141 and node O2) for enabling an appropriate value for the operating current of light-generating component 142, such that light (e.g., light L) may be emitted from a semiconductor junction J of light-emitting element 141 (e.g., at the p-n junction of anode A and cathode C of light-emitting diode D). The detected forward voltage $V_f$ of light-generating component 142 (e.g., of light-emitting element 141) may correlate with the temperature of light-emitting element 141 (e.g., temperature $T_j$ at its semiconductor junction J), as described below in more detail. In some embodiments, light-generating component 142 may include any suitable light-emitting element 141, which may be any suitable light-emitting diode, including, but not limited to, an inorganic light-emitting diode, an organic light-emitting diode, a high brightness light-emitting diode, a micro-light-emitting diode, a nano-light-emitting diode, and the like.

Display assembly 130 may also include one or more other components, such as a selection component 139 that may be operative to selectively address individual pixels of the display (e.g., an active matrix that may be electrically controlled (e.g., on a pixel by pixel basis) to selectively transmit therethrough and towards a particular portion of external surface 121 any light emitted from light emitting subassembly 140). Moreover, in some embodiments, as shown in FIG. 1C, for example, I/O interface assembly 111a (e.g., touch assembly input component 110a) may include a touch sensing assembly 124 (e.g., between external component 120 and display assembly 130 (e.g., between external component 120 and selection component 139), or at any other suitable location of I/O interface assembly 111), where touch sensing assembly 124 may be any suitable assembly operative to detect the position of one or more touch events or near touch events (e.g., by user U or any other suitable object in the external environment of device 100) along external surface 121 (e.g., a resistive touchscreen, a surface acoustic wave touchscreen, a capacitive sensing touchscreen, an infrared touchscreen, an acoustic pulse recognition touchscreen, etc.). In some embodiments, display assembly 130 may be described as including or being provided with touch sensing assembly 124. Additionally or alternatively, in some embodiments, display assembly 130 may be described as including or being provided with external component 120.

A component stack extending between a light-generating component 142 of display assembly 130 and external surface 121 may include any suitable elements of I/O interface assembly 111a. For example, as shown in FIG. 1C, a component stack 128 that may extend between light-generating component 142 and a point PO along external surface 121 (e.g., a point that may be the point of external surface 121 closest to light-generating component 142) may include various elements of I/O interface assembly 111a, including, but not limited to, a thickness of a portion of display assembly 130 above light-generating component 142 (e.g., a thickness of a portion of light-emitting subassembly 140 and/or a thickness of a portion of selection component 139), a thickness of a portion of touch sensing assembly 124, and a thickness of a portion of external component 120. As described below in more detail, the thermal conductance and/or the thermal resistance of light-transmitting component stack 128 (e.g., thermal resistance $R_{TH-LCS}$ of FIG. 1C) may be accessible to electronic device 100 (e.g., to processor 102) for leveraging by electronic device 100 (e.g., by processor 102) in combination with temperature Tj of light-generating component 142 (e.g., as may be determined based on the detected forward voltage $V_f$ of light-generating component 142) for any suitable purpose, such as for determining the temperature of external surface 121 at point PO (e.g., temperature $T_{SUR-PO}$ of FIG. 1C).

It is to be understood that, although I/O interface 111a has been described with respect to a "display" output component 112a and a "display" assembly 130, in some embodiments, such features may be operative to provide illumination of external surface 121 (e.g., to emit light through external surface 121) for general illumination purposes, decorative purposes, or simple informational purposes rather than as a conventional display for high-resolution informational purposes. For example, one or more light-generating components 142 of light-emitting subassembly 140 may be operative to illuminate external surface 121 of external component 120 that may be provided through an opening in housing 101 in the shape of a logo (e.g., through back wall 101k) when device 100 is turned on (e.g., a light-up logo on the back of a laptop computer). In such embodiments, only a single light-generating component 142 or a limited number of light-generating components 142 may need to be provided by light-emitting subassembly 140.

Display assembly output component 112a may include a particular one of various types of display assembly 130, each of which may include one or more light-generating components 142 arranged in a particular manner for emitting light for illuminating external surface 121 while also enabling determination of the temperature $T_j$ of the light-generating component 142 (e.g., via detection of a voltage or power of the light-generating component 142) for any suitable purpose (e.g., for thermal management of device 100, for detecting a user input, etc.). As just one example of a particular type of display assembly that may be provided by display assembly output component 112a, as shown in FIGS. 1D and 1E, a display assembly 130' may be a liquid crystal display ("LCD") assembly or any other suitable display assembly type that may be backlit with a light-emitting subassembly 140'. For example, as shown, light-emitting subassembly 140' of display assembly 130' may include a back light unit 143 (e.g., a light guide pipe) and a single light-generating component 142 (e.g., light-generating component 142-1 of FIG. 1D) or at least one row of a number of light-generating components 142 (e.g., N light-generating components 142-1 through 142-N along a row R of FIG. 1E) that may be operative to emit light into back light unit 143 (e.g., in the direction of arrow L2), where back light unit 143 may be operative to reflect that light within back light unit 143 and out from light-emitting subassembly 140' towards one or more portions of external surface 121 (e.g., in the direction of arrow L3 of FIG. 1D).

Display subassembly 130' may also include a selection component 139' that may be operative to selectively enable transmission of light from back light unit 143 through selection component 139' and towards external surface 121 (e.g., an active matrix that may be electrically controlled (e.g., on a pixel by pixel basis) to selectively transmit light therethrough from light-emitting subassembly 140' towards one or more portions of external surface 121). For example, as shown in FIG. 1D, display subassembly 130' may be a liquid crystal display subassembly with a selection component 139' that may include a bottom polarizing filter 135 (e.g., a polarizing filter film with a horizontal axis to block/pass certain light) that may be positioned above light emitting subassembly 140', a bottom substrate 134 (e.g., a glass electrode substrate with horizontal electrode film) that may be positioned above filter 135, a liquid crystal layer 133 (e.g., a twisted nematic device) that may be positioned above bottom substrate 134, a top substrate 132 (e.g., a glass electrode substrate with vertical electrode film perpendicular that of bottom substrate 134) that may be positioned above layer 133, and a top polarizing filter 131 (e.g., a polarizing filter film with a vertical axis perpendicular that of bottom polarizing filter 135) that may be positioned above top substrate 132. By controlling the electric field applied across liquid crystal layer 133 between each set of crossing electrodes of substrates 132 and 134 for each pixel of display assembly 130' (e.g., via a display application being run by processor 102), a varying amount of light reflected out from back light unit 143 up towards selection component 139' may be allowed to pass through selection component 139' and towards external surface 121.

In some embodiments, as shown in FIG. 1D, for example, I/O interface assembly 111*a* (e.g., touch assembly input component 110*a*) may include touch sensing assembly 124 between external component 120 and display assembly 130' (e.g., between external component 120 and selection component 139') or at any other suitable location of I/O interface assembly 111*a* of FIGS. 1D and 1E), where touch sensing assembly 124 may be any suitable assembly operative to detect the position of one or more touch events or near touch events (e.g., by user U or any other suitable object in the external environment of device 100) along external surface 121 (e.g., a resistive touchscreen, a surface acoustic wave touchscreen, a capacitive sensing touchscreen, an infrared touchscreen, an acoustic pulse recognition touchscreen, etc.). In some embodiments, display assembly 130' may be described as including or being provided with touch sensing assembly 124. Additionally or alternatively, in some embodiments, display assembly 130' may be described as including or being provided with external component 120.

A component stack extending between a light-generating component 142 of display assembly 130' and external surface 121 may include any suitable elements of I/O interface assembly 111*a*. For example, as shown in FIG. 1D, a component stack 128' that may extend between light-generating component 142-1 and a point PO-1 along external surface 121, which may be the closest point of external surface 121 to light-generating component 142-1, may include various elements of I/O interface assembly 111*a*, including, but not limited to, a thickness of a portion of display assembly 130' above light-generating component 142-1 (e.g., a thickness of a portion of light emitting subassembly 140' and/or a thickness of a portion of selection component 139'), a thickness of a portion of touch sensing assembly 124, and a thickness of a portion of external component 120. As described below in more detail, the thermal resistance of light-transmitting component stack 128' (e.g., thermal resistance $R_{TH\text{-}LCS\text{-}1}$ of FIG. 1D) may be accessible to electronic device 100 (e.g., to processor 102) for leveraging in combination with temperature $T_{j\text{-}1}$ of light-generating component 142-1 (e.g., as may be determined based on the detected forward voltage $V_{f\text{-}1}$ of light-generating component 142-1) for any suitable purpose, such as for determining the temperature of external surface 121 at point PO-1 (e.g., temperature $T_{SUR\text{-}PO\text{-}1}$ of FIG. 1D). Similarly, although not shown, each particular one of the other light-generating components 142-2 through 142-N along row R of FIG. 1E may have its own respective component stack extending therefrom to a particular respective portion of external surface 121, which may be the closest portion of external surface 121 to that particular light-generating component 142 (e.g., point PO-2 with respect to light-generating component 142-2 and point PO-N with respect to light-generating component 142-N of FIG. 1E), and the particular thermal resistance of each one of those other particular light-transmitting component stacks may also be accessible to electronic device 100 (e.g., to processor 102) for leveraging in combination with the particular temperature $T_j$ of each respective one of those other particular light-generating components (e.g., as may be determined based on the detected forward voltage $V_f$ of each one of those particular light-generating components (e.g., forward voltage $V_{f\text{-}2}$ of light-generating component 142-2 and forward voltage $V_{f\text{-}N}$ of light-generating component 142-N of FIG. 1E)) for any suitable purpose, such as for determining the temperature of external surface 121 at each one of those particular respective external surface portions.

Moreover, in some embodiments, although not shown, the entirety of row R of light-generating components 142-1 through 142-N of FIG. 1E may have its own row component stack extending therefrom to a particular respective portion of external surface 121, which may be the closest portion of external surface 121 to that row (e.g., portion PO-R with respect to row R of FIG. 1E), and the thermal resistance of that component stack of row R may also be accessible to electronic device 100 (e.g., to processor 102) for leveraging in combination with the temperature $T_j$ of the entirety of row R (e.g., as may be determined based on the detected forward voltage $V_{f\text{-}R}$ of the entirety of row R of FIG. 1E) for any suitable purpose, such as for determining the temperature of external surface 121 at portion PO-R.

Figure 1F:
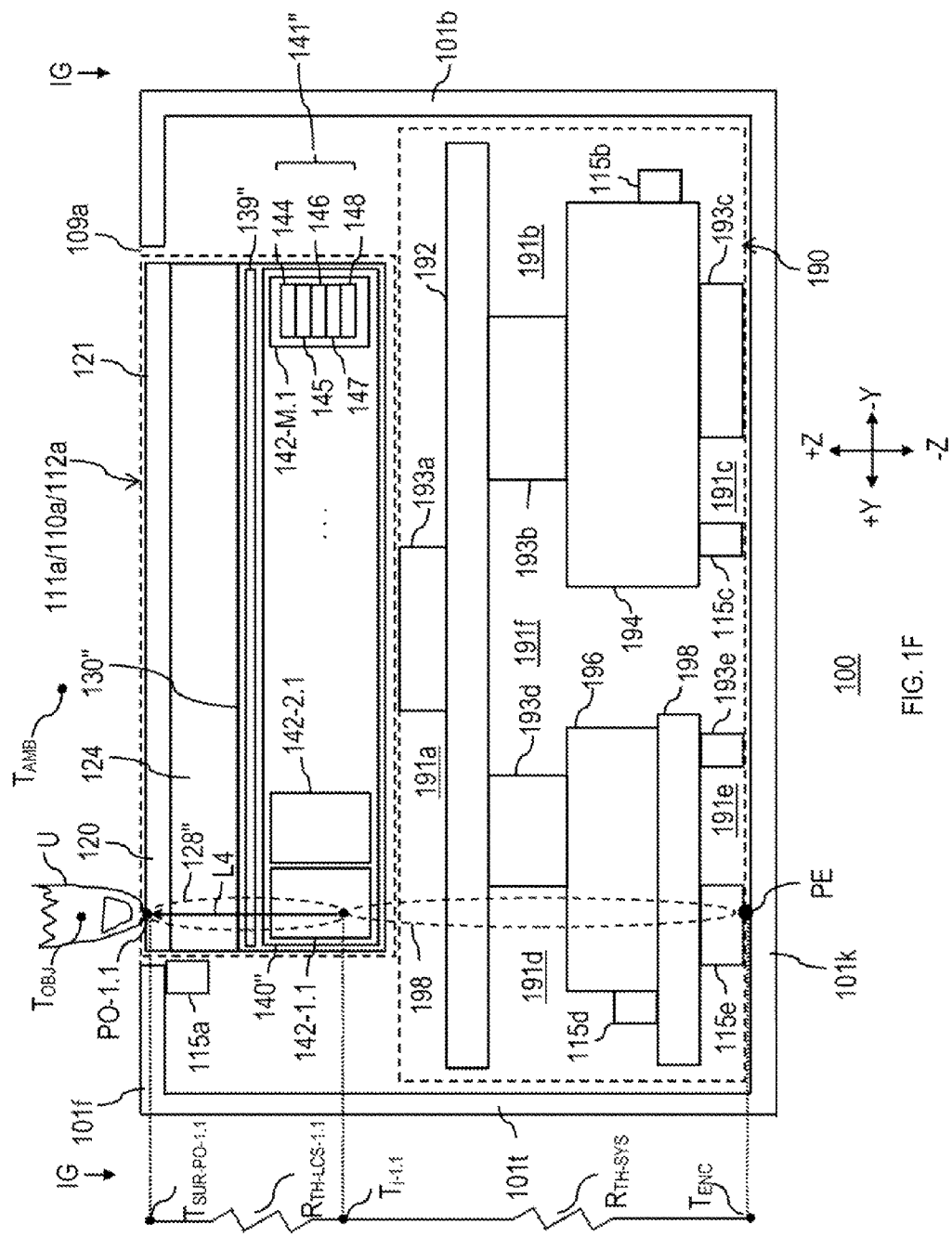
FIG. 1F is a cross-sectional view, similar to FIGS. 1C and 1D, of the electronic device of FIGS. 1-1C, but with another particular display assembly, in accordance with some embodiments.
Figure 1G:
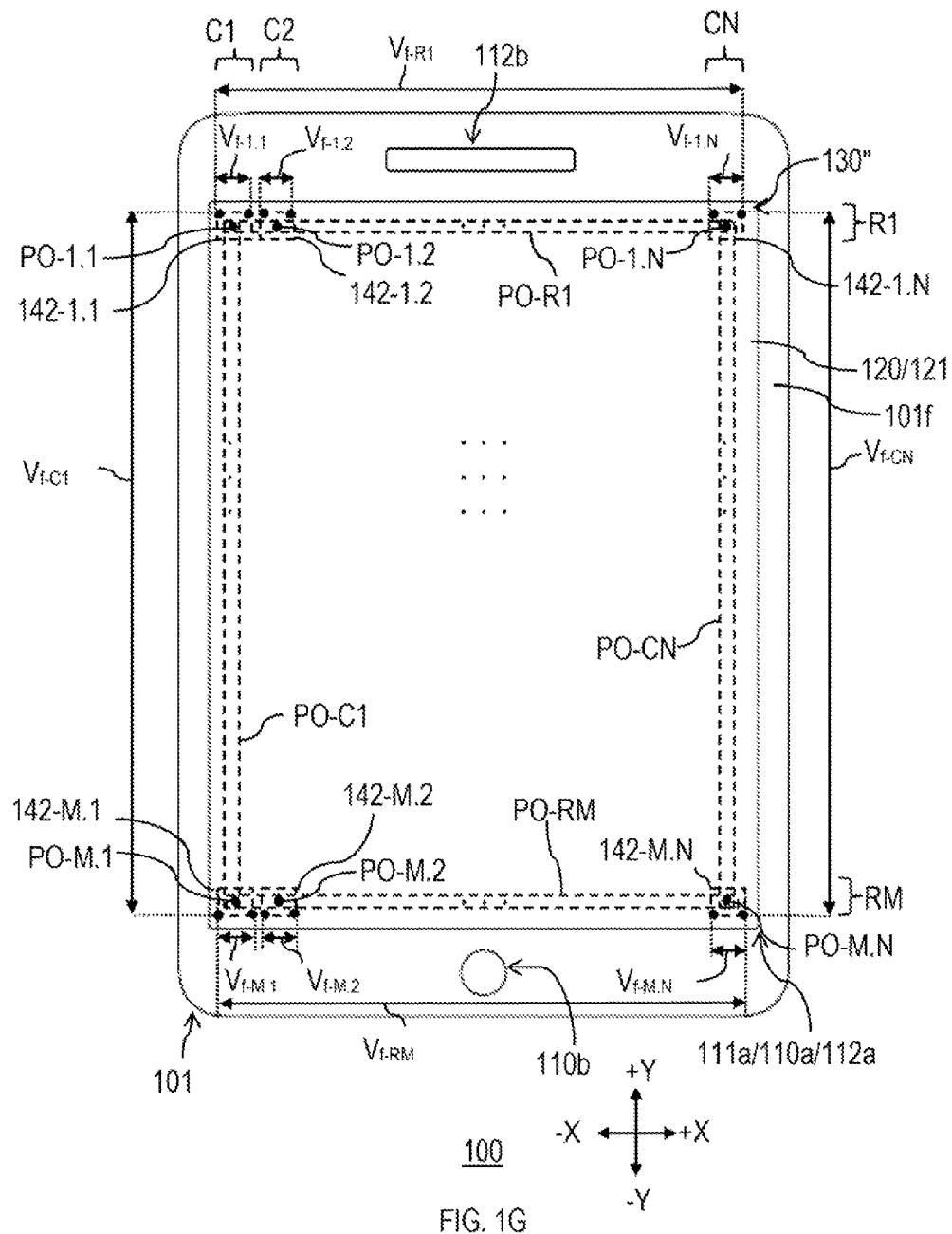
FIG. 1G is a front view, taken from line IG-IG of FIG. 1F, of the electronic device of FIGS. 1-1C and 1F, in accordance with some embodiments.
Figure 1H:
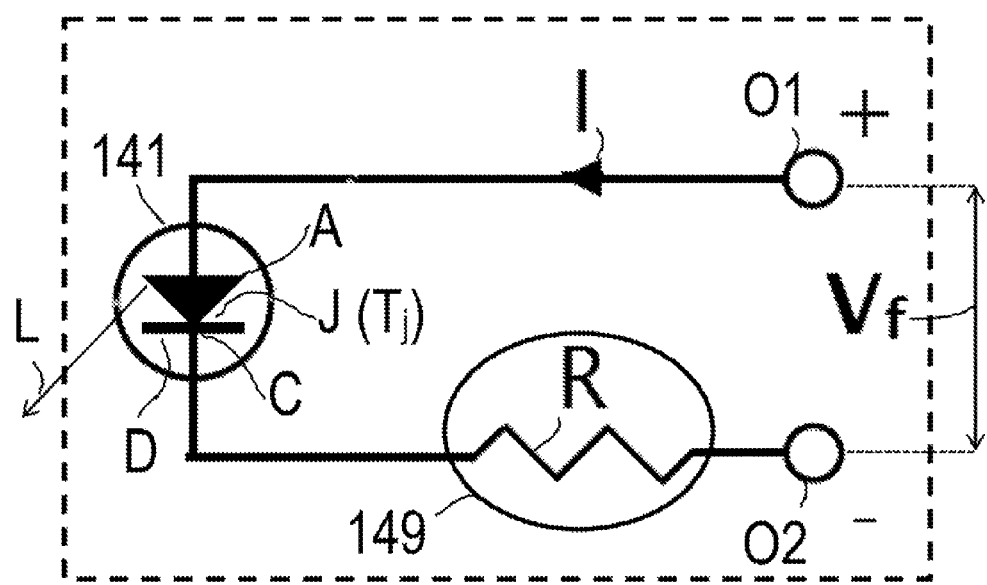
FIG. 1H is a schematic view of an exemplary light-generating component of the display assembly of the electronic device of FIGS. 1-1G, in accordance with some embodiments.

As another example of a particular type of display assembly that may be provided by display assembly output component 112*a*, as shown in FIGS. 1F and 1G, a display assembly 130" may be a light-emitting diode ("LED") display assembly or any other suitable display assembly type that may use an array of light-generating components 142 provided by a light-emitting subassembly 140" as pixels for the display. For example, as shown in FIGS. 1F and 1G, light-emitting subassembly 140" of display assembly 130" may include an array of light-generating components 142 arranged in rows and columns (e.g., in a matrix) underneath all or at least a substantial portion of external surface 121 of external component 120, where each light-generating component 142 may be operative to emit light towards a particular portion of external surface 121 while also enabling determination of its temperature $T_j$ for any suitable purpose. As just one example, as shown, light-emitting subassembly 140" of display assembly 130" may include an array of light-generating components 142 arranged in M rows R1-RM and N columns C1-CN, where row R1 may include light-generating components 142-1.1 through 142-1.N, row M may include light-generating components 142-M.1 through 142-M.N, column C1 may include light-generating components 142-1.1 through 142-M.1, column C2 may include light-generating components 142-1.2 through 142-M.2, and column CN may include light-generating components 142-1.N through 142-M.N (see, e.g., FIG. 1G). Each light-generating component 142 of light-emitting subassembly 140" may be operative to emit light (e.g., along the +Z-axis, such as in the direction of arrow L4 from light-generating component 142-1.1 of FIG. 1F) towards external component 120 for illuminating a particular pixel or a particular subset of pixels of display assembly 130". Each light-generating component 142 of light-emitting subassembly 140" may be any suitable light-generating component 142 that may include any suitable light-emitting element 141, such as an OLED, nano-LED, micro-LED, and the like. For example, as shown in FIG. 1F, light-generating component 142-M.1 may include a light-emitting element 141" that may include an LED cathode 148, above which may be positioned an electron transport layer ("ETL") 147, above which may be positioned an emissive layer ("EML") 146, above which may be positioned a hole transport layer ("HTL") 145, above which may be positioned an LED anode 144, which may be operative to emit light (e.g., when device 100 provides a current for flowing from cathode 148 to anode 144).

Display subassembly 130" may also include a selection component 139" that may be operative to selectively enable transmission of light from a particular light-generating component 142 of light-emitting subassembly 140" therethrough and towards external surface 121 (e.g., an active matrix that may be electrically controlled (e.g., on a pixel by pixel basis) to selectively transmit light therethrough from a respective light-generating component 142 of light-emitting subassembly 140" towards a respective portion of external surface 121). For example, as shown in FIG. 1F, display subassembly 130" may be an LED display assembly with a selection component 139" that may include an active matrix, which may be realized using a thin-film-transistor ("TFT") backplane or array, for addressing individual pixels, although any suitable selection component may be provided by display subassembly 130" either above, below, or integrated with light-emitting subassembly 140". By controlling each pixel of display assembly 130" with selection component 139" (e.g., via a display application being run by processor 102), a varying amount of light emitted by each respective light-generating component 142 of light-emitting subassembly 140" may be selectively allowed to illuminate a respective portion of external surface 121.

In some embodiments, as shown in FIG. 1F, for example, I/O interface assembly 111a (e.g., touch assembly input component 110a) may include touch sensing assembly 124 between external component 120 and display assembly 130" (e.g., between external component 120 and selection component 139") or at any other suitable location of I/O interface assembly 111a of FIGS. 1F and 1G, where touch sensing assembly 124 may be any suitable assembly operative to detect the position of one or more touch events or near touch events (e.g., by user U or any other suitable object in the external environment of device 100) along external surface 121 (e.g., a resistive touchscreen, a surface acoustic wave touchscreen, a capacitive sensing touchscreen, an infrared touchscreen, an acoustic pulse recognition touchscreen, etc.). In some embodiments, display assembly 130" may be described as including or being provided with touch sensing assembly 124. Additionally or alternatively, in some embodiments, display assembly 130" may be described as including or being provided with external component 120.

A component stack extending between a light-generating component 142 of display assembly 130" and external surface 121 may include any suitable elements of I/O interface assembly 111a. For example, as shown in FIG. 1F, a component stack 128" that may extend between light-generating component 142-1.1 and a point PO-1.1 along external surface 121, which may be the closest point of external surface 121 to light-generating component 142-1.1, may include various elements of I/O interface assembly 111a, including, but not limited, to a thickness of a portion of display assembly 130" above light-generating component 142-1.1 (e.g., a thickness of a portion of light-emitting subassembly 140" and/or a thickness of a portion of selection component 139"), a thickness of a portion of touch sensing assembly 124, and a thickness of a portion of external component 120. As described below in more detail, the thermal resistance of light-transmitting component stack 128" (e.g., thermal resistance $R_{TH-LCS-1.1}$ of FIG. 1F) may be accessible to electronic device 100 (e.g., to processor 102) for leveraging in combination with temperature $T_{j-1.1}$ of light-generating component 142-1.1 (e.g., as may be determined based on the detected forward voltage $V_{f-1.1}$ of light-generating component 142-1.1) for any suitable purpose, such as for determining the temperature of external surface 121 at point PO-1.1 (e.g., temperature $T_{SUR-PO-1.1}$ of FIG. 1F). Similarly, although not shown, each particular one of the other light-generating components 142-1.2 through 142-M.N of the array of light-generating components of light-emitting subassembly 140" may have its own respective component stack extending therefrom to a particular respective portion of external surface 121, which may be the closest portion of external surface 121 to that particular light-generating component 142 (e.g., point PO-1.2 with respect to light-generating component 142-1.2, point PO-1.N with respect to light-generating component 142-1.N, point PO-M.1 with respect to light-generating component 142-M.1, point PO-M.2 with respect to light-generating component 142-M.2, and point PO-M.N with respect to light-generating component 142-M.N of FIG. 1G), and the particular thermal resistance of each one of those other particular light-transmitting component stacks may also be accessible to electronic device 100 (e.g., to processor 102) for leveraging in combination with the particular temperature $T_j$ of each respective one of those other particular light-generating components (e.g., as may be determined based on the detected forward voltage $V_f$ of each one of those particular light-generating components (e.g., forward voltage $V_{f-1.2}$ of light-generating component 142-1.2, forward voltage $V_{f-1.N}$ of light-generating component 142-1.N, forward voltage $V_{f-M.1}$ of light-generating component 142-M.1, forward voltage $V_{f-M.2}$ of light-generating component 142-M.2, and forward voltage $V_{f-M.N}$ of light-generating component 142-M.N of FIG. 1G)) for any suitable purpose, such as for determining the temperature of external surface 121 at each one of those particular respective external surface portions.

Moreover, in some embodiments, although not shown, the entirety of each particular row of the array of light-generating components 142 of light-emitting subassembly 140" (e.g., each one of rows R1-RM of FIG. 1G) may have its own row component stack extending therefrom to a particular respective portion of external surface 121, which may be the closest portion of external surface 121 to that row (e.g., portion PO-R1 with respect to row R1 and portion PO-RM with respect to row RM of FIG. 1G), and the particular thermal resistance of each particular row component stack may also be accessible to electronic device 100 (e.g., to processor 102) for leveraging in combination with the particular temperature $T_j$ of the entirety of that particular row (e.g., as may be determined for row R1 based on the detected forward voltage $V_{f-R1}$ of the entirety of row R1 and as may be determined for row RM based on the detected forward voltage $V_{f-RM}$ of the entirety of row RM of FIG. 1G) for any suitable purpose, such as for determining the temperature of external surface 121 at the respective external surface portion (e.g., portion PO-R1 with respect to row R1 and portion PO-RM with respect to row RM of FIG. 1G). Additionally or alternatively, in some embodiments, although not shown, the entirety of each particular column of the array of light-generating components 142 of light-emitting subassembly 140" (e.g., each one of columns C1-CN of FIG. 1G) may have its own column component stack extending therefrom to a particular respective portion of external surface 121, which may be the closest portion of external surface 121 to that particular column (e.g., portion PO-C1 with respect to column C1 and portion PO-CN with respect to column CN of FIG. 1G), and the particular thermal resistance of each particular column component stack may also be accessible to electronic device 100 (e.g., to processor 102) for leveraging in combination with the particular temperature $T_j$ of the entirety of that particular column (e.g., as may be determined for column C1 based on the detected forward voltage $V_{f-C1}$ of the entirety of column C1 and as may be determined for column CN based on the detected forward voltage $V_{f-CN}$ of the entirety of column CN of FIG. 1G) for any suitable purpose, such as for determining the temperature of external surface 121 at the respective external surface portion (e.g., portion PO-C1 with respect to column C1 and portion PO-CN with respect to column CN of FIG. 1G).

As also shown in each one of FIGS. 1C, 1D, and 1F, in addition to I/O interface assembly 111a, electronic device 100 may include any suitable system assembly 190 positioned within housing 101, where system assembly 190 may include any suitable component or components of device 100 (e.g., other than display assembly output component 112a). For example, as shown, system assembly 190 may include a support component 192, such as a mid-plate, that may extend from an interior surface of a structural wall of housing 101 (not shown). In some embodiments, as shown in FIG. 1C, for example, I/O interface assembly 111a (e.g., a bottom of display assembly 130) may be positioned in front of and separated from support component 192 by any suitable distance, such that an air gap 191a may exist in a space between I/O interface assembly 111a and support component 192. Moreover, in some embodiments, a coupling 193a may be provided for structurally coupling at least a portion of I/O interface assembly 111a to support component 192 (e.g., to a front surface of support component 192) such that support component 192 may be enabled to provide some structural support for I/O interface assembly 111a. Alternatively, in other embodiments, air gap 191a may extend the entirety of the space between I/O interface assembly 111a and support component 192 (e.g., such that an air gap may separate I/O interface assembly 111a from any component of system assembly 190).

One or more other components of system assembly 190 may be coupled to support component 192 or at least positioned in a space between support component 192 and a portion of housing 101 (e.g., between support component 192 and back wall 101k). For example, as shown in FIG. 1C, system assembly 190 may include a power component 194, such as a battery or any other suitable component of power supply 108 of device 100. Power component 194 may be positioned between I/O interface assembly 111a and a wall of housing 101 (e.g., between support component 192 and back wall 101k). In some embodiments, as shown in FIG. 1C, for example, power component 194 may be positioned in back of and separated from support component 192 by any suitable distance, such that an air gap 191b may exist in a space between power component 194 and support component 192 (e.g., where a portion of air gap 191a and a portion of air gap 191b may combine to exist in a space between power component 194 and I/O interface 111a, with or without support component 192). Moreover, in some embodiments, a coupling 193b may be provided for structurally coupling at least a portion of power component 194 to support component 192 (e.g., to a back surface of support component 192) such that support component 192 may be enabled to provide some structural support for power component 194. Alternatively, in other embodiments, air gap 191b may extend the entirety of the space between power component 194 and support component 192 (e.g., such that an air gap may separate power component 194 from support component 192 and/or I/O interface assembly 111a (e.g., along the Z-axis)). Additionally or alternatively, as also shown in FIG. 1C, for example, power component 194 may be positioned in front of and separated from back wall 101k of housing 101 by any suitable distance, such that an air gap 191c may exist (e.g., along the Z-axis) in a space between power component 194 and back wall 101k. Moreover, in some embodiments, a coupling 193c may be provided for structurally coupling at least a portion of power component 194 to back wall 101k (e.g., to an interior surface of back wall 101k) such that back wall 101k may be enabled to provide some structural support for power component 194. Alternatively, in other embodiments, air gap 191c may extend the entirety of the space between power component 194 and back wall 101k (e.g., such that an air gap may entirely separate power component 194 from back wall 101k).

In addition to or instead of power component 194, one or more other components of system assembly 190 may be coupled to support component 192 or at least positioned in a space between support component 192 and a portion of housing 101 (e.g., between support component 192 and back wall 101k). For example, as shown in FIG. 1C, system assembly 190 may include at least one integrated circuit or system on chip ("SoC") 196 that may integrate or otherwise include at least a portion of one, some, or all components of device 100 or couplings therefor (e.g., processor 102, memory 104, communications component 106, etc.) into a single chip, and chip 196 may be mounted on or otherwise coupled to a main logic board ("MLB") 198 that may support and/or interconnect various components integrated thereon or coupled thereto. Chip 196 may be positioned between I/O interface assembly 111a and a wall of housing 101 (e.g., between support component 192 and back wall 101k). In some embodiments, as shown in FIG. 1C, for example, chip 196 may be positioned in back of and separated from support component 192 by any suitable distance, such that an air gap 191d may exist (e.g., along the Z-axis) in a space between chip 196 and support component 192 (e.g., where a portion of air gap 191a and a portion of air gap 191d may combine to exist in a space between chip 196 and I/O interface 111a, with or without support component 192). Moreover, in some embodiments, a coupling 193d may be provided for structurally coupling at least a portion of chip 196 to support component 192 (e.g., to a back surface of support component 192) such that support component 192 may be enabled to provide some structural support for chip 196. Alternatively, in other embodiments, air gap 191d may extend the entirety of the space between chip 196 and support component 192 (e.g., such that an air gap may entirely separate chip 196 from support component 192 and/or I/O interface assembly 111a (e.g., along the Z-axis)). Additionally or alternatively, as also shown in FIG. 1C, for example, board 198 may be positioned in front of and separated from back wall 101k of housing 101 by any suitable distance, such that an air gap 191e may exist (e.g., along the Z-axis) in a space between board 198 and back wall 101k. Moreover, in some embodiments, a coupling 193e may be provided for structurally coupling at least a portion of board 198 to back wall 101k (e.g., to an interior surface of back wall 101k) such that back wall 101k may be enabled to provide some structural support for board 198. Alternatively, in other embodiments, air gap 191e may extend the entirety of the space between board 198 and back wall 101k (e.g., such that an air gap may entirely separate board 198 from back wall 101k). Moreover, in some embodiments, as shown in FIG. 1C, for example, an air gap 191f may extend (e.g., along the Z-axis) in a space between at least a portion of back wall 101k of housing 101 and I/O interface assembly 111a and/or support component 192 (e.g., where a portion of air gap 191a and a portion of air gap 191f may combine to exist in a space between back wall 101k and I/O interface 111a, with or without support component 192). Each one of coupling elements 193a-193e may be any suitable coupling element, such as an adhesive (e.g., a pressure-sensitive adhesive ("PSA")) or a screw or the like.

One, some, or all of the auxiliary sensors 115 of auxiliary sensor assembly 114 may be provided by system assembly 190. An auxiliary sensor 115 may be positioned within device 100 (e.g., within housing 101) at any suitable location for detecting one or more auxiliary characteristics related to a current operation, performance, or environmental condition of one or more electronic components or areas of electronic device 100, where such a detected characteristic may be utilized for at least partially controlling a functionality of electronic device 100, such as for controlling a thermal management functionality of electronic device 100. For example, as shown in FIG. 1C, an auxiliary sensor 115b of auxiliary sensor assembly 114 may be positioned adjacent a first surface of power component 194 (e.g., between bottom wall 101b and a bottom surface of power component 194) and/or an auxiliary sensor 115c of auxiliary sensor assembly 114 may be positioned adjacent another surface of power component 194 (e.g., between back wall 101k and a back surface of power component 194 adjacent air space 191c and/or coupling 193c). Additionally or alternatively, as also shown in FIG. 1C, for example, an auxiliary sensor 115d of auxiliary sensor assembly 114 may be positioned adjacent a first surface of chip 196 and a first surface of board 198 (e.g., between top wall 101t and a top surface of chip 196) and/or an auxiliary sensor 115e of auxiliary sensor assembly 114 may be positioned adjacent another surface of board 198 (e.g., between back wall 101k and a back surface of board 198 adjacent air space 191e and/or coupling 193e). Each one of auxiliary sensors 115b-115e may be positioned proximal to one or more components of system assembly 190 and/or housing walls of housing 101 to detect one or more auxiliary characteristics (e.g., temperature) related to a current operation, performance, or environmental condition of those one or more components/housing walls of electronic device 100, where each detected characteristic of each sensor 115 may be utilized (e.g., by processor 102) for at least partially controlling a functionality of electronic device 100, such as for controlling a thermal management functionality of electronic device 100.

As just one particular example, as shown in FIG. 1C, auxiliary sensor 115e may be any suitable temperature sensor that may be positioned within device 100 for detecting the temperature $T_{ENC}$ of a portion of housing 101 at point PE of back wall 101k. Although detected temperature $T_{ENC}$ may be useful for determining a temperature of an exterior surface of back wall 101k that may be exposed to user U or for determining a temperature of at least a portion of board 198 adjacent sensor 115e (e.g., for improving thermal management of device 100 (e.g., to prevent overheating of device 100)), detected temperature $T_{ENC}$ of sensor 115e may not be a rather effective data point for determining a temperature of external surface 121 of external component 120. For example, despite point PE of $T_{ENC}$ of sensor 115e being in-line (e.g., along the Z-axis) with point PO of external surface 121, the thermal resistance of the component stack between point PE at sensor 115e and point PO of external surface 121 may be too unwieldy to be leveraged with TEN for determining $T_{SUR-PO}$. As shown in FIG. 1C, the thermal resistance of the component stack between point PO and point PE may include the thermal resistance $R_{TH-LCS}$ of component stack 128 extending between point PO and light-generating component 142 of display assembly 130 in combination with the thermal resistance $R_{TH-SYS}$ of component stack 198 extending between light-generating component 142 and point PE. Although the construction of component stack 128 may enable its thermal resistance $R_{TH-LCS}$ to be predictable or consistently known or accessible to device 100 for effectively being leveraged in conjunction with determined temperature $T_j$ to reliably determine temperature $T_{SUR-PO}$ at point PO (e.g., due to the fact that I/O assembly 111a of component stack 128 may be a fully laminated air gapless stack up spanning a relatively short distance with a relatively low thermal resistance, such that temperature $T_j$ may be more sensitive to changes in $T_{SUR-PO}$), the construction of component stack 198 may be such that its thermal resistance $R_{TH-SYS}$ is difficult to predict or determine during use of device 100 for effectively being leveraged in conjunction with determined temperature $T_{ENC}$ and $R_{TH-LCS}$ to reliably determine temperature $T_{SUR-PO}$ at point PO (e.g., due to the fact that component stack 198 may include one or more air gaps (e.g., air gaps 191a and 191d), one or more components (e.g., components 192, 196, and 198), and the like spanning a relatively large distance with a relatively high thermal resistance, such that temperature $T_{ENC}$ may not be as sensitive to changes in $T_{SUR-PO}$). Therefore, through leveraging a detectable forward voltage of a light-generating component of I/O assembly 111a to determine the temperature of the light-generating component (e.g., via a known voltage-temperature correlator of the light-generating component), not only may a new source of accurate temperature data (e.g., temperature $T_j$) be provided at a new location within device 100 (e.g., at point PJ of light-generating component 142 within display assembly 130 (e.g., at a location where a dedicated thermal sensing component 115 may not be easily positioned)) for any suitable purpose (e.g., for use in improving thermal management of device 100), but that new temperature data may itself be leveraged for more accurately determining the temperature of yet another location with respect to device 100 (e.g., temperature $T_{SUR-PO}$ at location PO on external surface PO (e.g., at yet another location where a dedicated thermal sensing component 115 may not be easily positioned)) for any suitable purpose (e.g., for use in detecting the temperature or position of an object external to device 100 (e.g., user U)). The various functionalities of device 100 that may be impacted by leveraging the forward voltage of one or more light-generating components of any suitable display assembly of FIGS. 1C-1H may now be described in relation to a sensor management system 201 of device 100 of FIG. 2.

Figure 2:
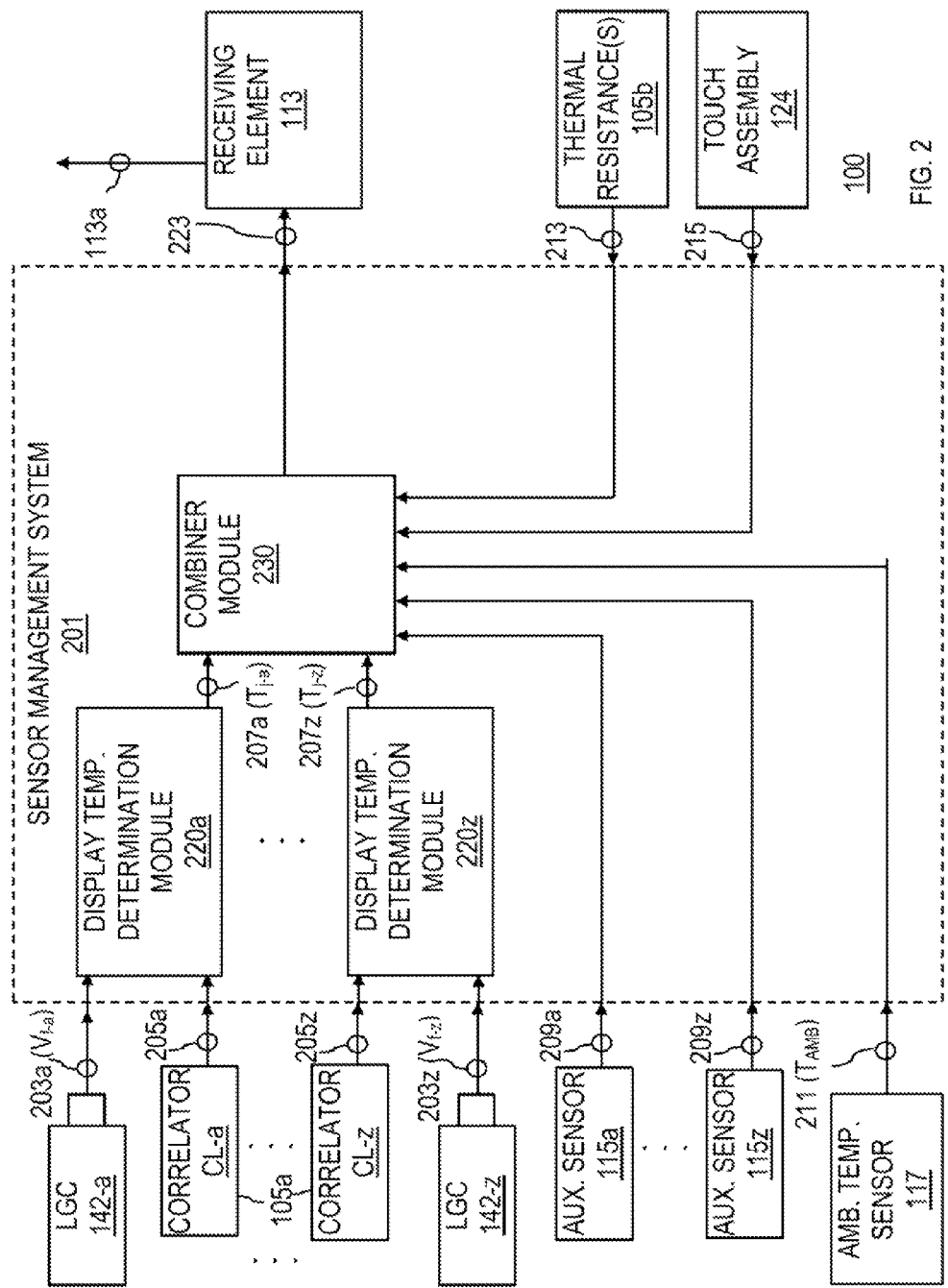
FIG. 2 is a schematic view of an illustrative portion of the electronic device of FIGS. 1-1H, in accordance with some embodiments.

FIG. 2 shows a schematic view of a sensor management system 201 of electronic device 100 that may be provided to enable the determination of, and/or use of, the temperature of one or more light-generating components of a display assembly of device 100. System 201 may be configured to receive or otherwise detect the current or most recent forward voltage $V_f$ of at least one light-generating component 142 of a display assembly 130, to access or otherwise determine any suitable forward voltage-temperature correlator CL for that light-generating component 142, and to leverage such a detected forward voltage $V_f$ in combination with such an accessed correlator CL to determine the current temperature of that light-generating component 142. For example, as shown, a first display temperature determination module 220a may be configured to receive or otherwise detect first particular forward voltage data 203a (e.g., forward voltage $V_{f-a}$) from a first light-generating component ("LGC") 142-a of device 100, to access or otherwise determine first forward voltage-temperature correlator data 205a (e.g., correlator CL-a) for first light-generating component 142-a, and then to determine current temperature data 207a (e.g., temperature $T_{j-a}$) for first light-generating component 142-a based on forward voltage data 203a and correlator data 205a. Such operations may be repeated by display temperature determination module 220a at any suitable rate for continuously monitoring the current forward voltage of light-generating component 142-a by continuously receiving updated forward voltage data 203a and then leveraging that forward voltage data with correlator CL-a of correlator data 205a for continuously determining the current temperature of light-generating component 142-a and continuously re-defining current temperature data 207a.

Forward voltage data 203a may be detected via any suitable circuitry or sensing apparatus provided at light-generating component 142-a (e.g., via nodes O1 and O2 of component 142 of FIG. 1H). Correlator CL-a of correlator data 205a may be any suitable correlator that may be used to determine the current temperature of light-generating component 142-a based on any value of a detected current forward voltage $V_{f-a}$ of light-generating component 142-a. For example, correlator CL-a may be a look-up table with multiple distinct associations between a particular forward voltage and a particular temperature, where first display temperature determination module 220a may be enabled to leverage received voltage $V_{f-a}$ of data 203a to identify a particular appropriate association of the look-up table of correlator CL-a of data 205a, and where first display temperature determination module 220a may then determine the particular temperature of that identified particular association of the look-up table to be used as the current temperature $T_{j-a}$ of output current temperature data 207a. As another example, correlator CL-a may be a polynomial curve or equation that may approximate the dependence between the forward voltage of light-generating component 142-a and the temperature of light-generating component 142-a at various voltages/temperatures, where first display temperature determination module 220a may be enabled to leverage received voltage $V_{f-a}$ of data 203a in combination with such a curve or equation to identify the appropriate temperature to be used as the current temperature $T_{j-a}$ of output current temperature data 207a. Such a correlator CL-a may be defined by a testing process carried out on light-generating component 142-a prior to incorporating light-generating component 142-a in a display assembly 130 and/or prior to incorporating such a display assembly 130 into device 100 and/or after incorporating such a display assembly 130 into device 100 (e.g., a process during which light-generating component 142-a may be positioned in an environment of a known temperature and then its forward voltage may be measured and associated with that known temperature, and during which that sub-process may be repeated one or more times after altering the known temperature of the environment). Any suitable correlator CL-a may be accessible by display temperature determination module 220a as correlator data 205a from any suitable source (e.g., stored data from memory portion 105a of memory 104 of device 100 or data from a remote source, such as from at least a portion of data 55 from server 50).

In addition to system 201 including first display temperature determination module 220a for determining first current temperature data 207a (e.g., temperature $T_{j-a}$) for first light-generating component 142-a based on forward voltage data 203a (e.g., forward voltage $V_{f-a}$) and correlator data 205a (e.g., correlator CL-a), system 201 may include any suitable number Z-1 of additional temperature determination modules, including $Z^{th}$ display temperature determination module 220z for determining current temperature data 207z (e.g., temperature $T_{j-z}$) for light-generating component 142-z of device 100 based on forward voltage data 203z (e.g., forward voltage $V_{f-z}$) from light-generating component 142-z and correlator data 205z (e.g., correlator CL-z) for light-generating component 142-z, as shown in FIG. 2. Each one of light-generating components 142-a through 142-z may be different light-generating components or different combinations of light-generating components of the same display assembly 130, such as light-generating components 142-1 through 142-N and/or the entire row R of light-generating components of display assembly 130' of FIGS. 1D and 1E, or such as light-generating components 142-1.1 through 142-M.N and/or any entire row or column of light-generating components of display assembly 130" of FIGS. 1F and 1G. The correlator data 205 for different light-generating components 142 of device 100 (e.g., correlator CL-a of first correlator data 205a for first light-generating component 142-a and correlator CL-b of $Z^{th}$ correlator data 205z for $Z^{th}$ light-generating component 142-z) may be the same or different, for example, depending on whether the light-generating components are of the same type and/or whether different tests were conducted for each individual light-generating component in order to define distinct correlators, whether or not the individual light-generating components are of the same type.

System 201 may also be configured to process any current temperature data of any light-generating component 142 of a display assembly 130 (e.g., any temperature data 207a-207z as may be determined by one or more display temperature determination modules 220a-220z) alone or in conjunction with any other suitable data at a combiner module 230 for generating and transmitting system output data 223, where system output data 223 may be any suitable data indicative of any suitable information that may be of any suitable use by any suitable receiving element 113 (e.g., an active application 103 of device 100) for adjusting any suitable functionality of device 100 (e.g., for performing an adjustment 113a of a functionality of device 100). Any other suitable data may be received by combiner module 230 for processing in combination with temperature data 207 of one or more light-generating components 142, including, but not limited to, auxiliary sensor data 209a-209z that may be indicative of any suitable device characteristics as may be sensed by one or more respective auxiliary sensors 115a-115z, ambient temperature data 211 that may be indicative of the ambient temperature $T_{AMB}$ of the environment external to device 100 as may be sensed by any suitable ambient temperature sensor 117, thermal resistance data 213 that may be indicative of the thermal resistance of any one or more component stacks of device 100 (e.g., thermal resistance $R_{TH-LCS}$ of component stack 128) from any suitable thermal resistance source 105b (e.g., memory portion 105b of memory 104), and/or any suitable touch position data 215 from any suitable touch sensing assembly 124 of device 100. Additionally or alternatively, any other suitable data available to device 100 may be received and processed by module 230 in combination with any of the above-mentioned data for generating and transmitting system output data 223.

In some embodiments, ambient temperature sensor 117 may be a temperature sensor external to device 100 that may sense ambient temperature $T_{AMB}$ (e.g., sensor 57 of FIG. 1) and that may provide data indicative of that sensed temperature to remote server 50 for sharing with device 100 as at least a portion of communicated data 55 for use by device 100 as ambient temperature data 211, where, for example, server 50 may be a national weather service provider (e.g., www.weather.com) or a temperature sensing system local to the environment in which device 100 is currently positioned (e.g., a home's smart-thermostat). In other embodiments, ambient temperature sensor 117 may be a temperature sensor of device 100 that may be directly exposed to ambient temperature $T_{AMB}$ (e.g., auxiliary sensor 15a of FIG. 1C that may be positioned adjacent opening 109a) and that may be operative to sense ambient temperature $T_{AMB}$ and provide ambient temperature data 211 to system 201.

Thermal resistance data 213 indicative of the thermal resistance and/or thermal conductance of any suitable component stack of device 100 may be determined and made accessible to device 100 via any suitable testing process that may be carried out on that component stack prior to incorporating that component stack into device 100 or after incorporating that component stack into device 100 (e.g., a process where a known temperature may be applied to one side of the stack and the temperature at the other side of the stack may be detected and used in conjunction with the known temperature to calculate the thermal resistance of the stack for that known temperature, and then that process may or may not be repeated for various other known temperatures, such that a single thermal resistance value may be accessible and used whenever a stack's thermal resistance is to be used in conjunction with any temperature $T_j$ of a light-generating component 142 for determining an external surface temperature $T_{SUR}$, or such that different thermal resistance values may be accessible and used for a stack's thermal resistance in conjunction with different respective values of temperature $T_j$ of a light-generating component 142 for determining an external surface temperature $T_{SUR}$).

As just one example of the many various ways in which system output data 223 may be generated and used, combiner module 230 may be operative to receive and process one or more instances of auxiliary sensor data 209b-209e from one or more of auxiliary sensors 115b-115e of FIG. 1C in combination with one or more instances of display temperature data 207a-207z associated with one or more light-generating components 142 of I/O interface assembly 111a for generating and transmitting system output data 223 indicative of a thermal temperature profile of device 100, which may be used by receiving element 113 (e.g., a thermal management application 103) of device 100 for adjusting any suitable functionality of device 100, such as for enabling or disabling a cooling component of device 100 (e.g., a fan) for altering the temperature within housing 101 to be within an acceptable temperature range, for dynamic frequency scaling (e.g., throttling) any suitable component of device 100 to prevent over-heating of device 100, and/or the like. For example, module 230 may be operative to enable any suitable closed-loop thermal management ("CLTM") process or processes (e.g., CLTM software) that may be dictated by various temperature data 207 and 209 and/or finite element simulation (e.g., look-up tables) to determine whether the current thermal profile of device 100 ought to incite the performance of any suitable adjustment of any suitable functionality of device 100. By enabling the determination of the temperature $T_j$ at one or more suitable points PJ of a display assembly of device 100, system 201 may leverage that additional temperature data source in combination with any temperature or other operational data that may be detected by one or more suitable auxiliary sensors 115 for increasing the effectiveness and/or efficiency and/or accuracy of any thermal management processes of device 100.

As another example, combiner module 230 may be operative to receive and process one or more instances of thermal resistance data 213 associated with one or more appropriate component stacks (e.g., data indicative of thermal resistance $R_{TH-LCS}$ of stack 128 of FIG. 1C) in combination with one or more instances of display temperature data 207a-207z associated with one or more light-generating components 142 of I/O interface assembly 111a (e.g., temperature $T_j$ of light-generating component 142 of FIG. 1C) for determining at least one external surface temperature (e.g., $T_{SUR-PO}$ of surface point PO of FIG. 1C) and for generating and transmitting system output data 223 indicative of at least that determined external surface temperature, which may be used by receiving element 113 for any suitable purpose. For example, such output data 223 may be used by receiving element 113 as a thermal management application 103, as described above, for determining how to adjust a functionality of device 100 for thermal management purposes (e.g., to cool or heat or otherwise attempt to affect the temperature of one or more components of device 100). In some embodiments, device 100 (e.g., module 230) may be operative to determine that a determined external surface temperature is due to an external object (e.g., user U) and generate output data 223 accordingly, whereby such data 223 may be used by receiving element 113 as a thermometer application 103 that may share the detected temperature with the user (e.g., via an output on display output component 112a of I/O assembly 111a or via audio output component 112b or via any other suitable technique), such that a detected temperature of such an external object may be made known to the user. This may be useful in many suitable scenarios, such as when user U may wish to detect the temperature of the user's body (e.g., $T_{OBJ}$ of FIG. 1C), whereby the user may hold his ear or any other suitable body part up against or near external surface 121 such that the user's temperature may be detected by device 100. Receiving element 113 may be a biometric or health-based application 103 that may be operative to determine and/or store and/or otherwise use a biometric temperature reading of a user for any suitable purpose, such as recommending that the user adjust an exercise routine in some way (e.g., instruct the user to rest for 3 minutes because the user's detected body temperature is currently too high). In some embodiments, such a health-based application 103 may instruct the user on how and where to hold a body part against external surface 121 (e.g., "please place your ear against the top of external surface 121 for 10 seconds" (e.g., adjacent row R of FIG. 1D)) such that system 201 may be enabled to adequately process data for determining the user's temperature via one or more light-generating components 142. Device 100 may be operative to indicate to the user (e.g., via a graphic element on display 112a) where to touch external surface 121 in order for system 201 to more efficiently or effectively determine the temperature of the user (e.g., by only analyzing the change in temperature of the one or more portions of surface 121 at which the user has been instructed to touch surface 121 (e.g., by determining that $T_{SUR-PO}$ is $T_{OBJ}$ at point PO). It is to be understood that this may be done with or without the aid of any suitable touch position data 215 from any suitable touch sensing assembly 124 of device 100 that may be indicative of the position of an external touch event on input assembly 110a, as device 100 may be operative to process determined temperature data of one or more portions of external surface 121 (e.g., changes in temperature data of one or more portions of surface 121 over a certain period of time) in order to determine that an external object's temperature has been detected at one or more of those portions (e.g., through a determination of an isolated increase or decrease in temperature at a certain portion of surface 121 via only data 207 at module 230 and not necessarily in conjunction with a determination of a specific location of a touch event on surface 121 via data 215 from touch assembly 124). In some embodiments, rather than for detecting a temperature of user U, user U may leverage system 201 for measuring the temperature $T_{OBJ}$ of some external object (e.g., the temperature of a baby's bottle) that may be positioned against or near external surface 121.

In some embodiments, combiner module 230 may be operative to receive and process one or more instances of thermal resistance data 213 associated with one or more appropriate component stacks (e.g., data indicative of thermal resistance $R_{TH-LCS}$ of stack 128 of FIG. 1C) in combination with one or more instances of display temperature data 207a-207z associated with one or more light-generating components 142 of I/O interface assembly 111a (e.g., temperature $T_j$ of light-generating component 142 of FIG. 1C) for determining at least one external surface temperature (e.g., $T_{SUR-PO}$ of surface point PO of FIG. 1C) and for generating and transmitting system output data 223 indicative of at least that external surface temperature, which may be used by receiving element 113 for any suitable purpose other than relaying a detected temperature (e.g., of a user or external object (e.g., $T_{OBJ}$)) to a user. For example, such output data 223 may be used by receiving element 113 as a user touch input detection application 103. In some embodiments, device 100 may be operative to determine that a determined external surface temperature is due to a touch or near touch event by an external object (e.g., user U) at one or more particular locations along external surface 121 (e.g., due to a localized increase or decrease in temperature that may be similar to an expected temperature of user U and/or at a location on external surface 121 that may be associated with a selectable displayed graphical element of display component 112a or otherwise that device 100 may be operative to determine is a touch event indicative of a particular user input (e.g., an input intended to select that displayed graphical element)). For example, through detection of a localized change in temperature along a portion of surface 121 using received data 207 (e.g., over time), module 230 may be operative to determine that a touch or near touch event or gesture has occurred at a particular location or along a particular path on external surface 121 and that that touch event data may be leveraged (e.g., as output data 223) by receiving element 113 for altering any suitable functionality of device 100, where receiving element 113 may be any suitable interactive application 103 that may be operative to utilize any suitable touch event input data for dictating any resulting application output data (e.g., generating a new user interface display, opening another application, saving a file, taking a picture, etc.).

Touch position data 215 from touch assembly 124 may be indicative of a position or positions or a path along surface 121 at which one or more touch or near touch events have been detected by touch assembly 124. Such touch position data 215 may be leveraged by combiner module 230 in any suitable way in conjunction with any display temperature data 207 for generating and transmitting any suitable output data 223 to any suitable receiving element 113. For example, when it is determined via touch position data 215 that a particular position of external surface 121 is being touched (e.g., by user U at point PO), device 100 may be operative to more effectively and efficiently determine the temperature of the external object causing that touch event (e.g., $T_{OBJ}$ of user U) by determining temperature $T_{SUR-PO}$, for example, by determining that temperature before or instead of attempting to determine the external surface temperature of any other portion of external surface 121 (e.g., to focus processing power on that location at which a touch event is currently being detected). Additionally or alternatively, by knowing that a touch event is occurring at a particular position on surface 121 (e.g., via touch position data 215), device 100 may be operative to determine that a portion of a user's body or other detectable external object is at that particular position such that device 100 may be operative to determine the temperature at that position as the temperature of such an external object for any suitable use (e.g., biometric or health or thermometer applications, such as those mentioned above). Additionally or alternatively, temperature data 209 from one or more auxiliary sensors 115 may be leveraged by combiner module 230 in conjunction with display temperature data 207, with or without touch data 215, to more accurately determine the position of a potential touch event along surface 121. For example, if temperature data 209 from one or more auxiliary sensors 115 indicates that the temperature at or near system on chip ("SoC") 196 is high (e.g., above a certain threshold value or at a particular value that may be determined to have a particular effect on the temperature of one or more light-generating components 142 that may be positioned directly above or nearby SoC 196), then any temperature of at least one light-generating component 142 that may be proximate chip 196 (e.g., components 142-1.1 and 142-2.1 but not component 142-M.1) may be at least partially attributed (e.g., by combiner module 230) to the temperature of chip 196 such that the detected temperature of chip 196 may be accounted for when module 230 may be attempting to detect a localized change in temperature along a portion of surface 121 at point PO-1.1 using received data 207, and/or while any temperature of at least one light-generating component 142 that may be removed from chip 196 (e.g., components 142-M.1 but not components 142-1.1 and 142-2.1) may not be attributed (e.g., by combiner module 230) to the temperature of chip 196 such that the detected temperature of chip 196 may not be accounted for when module 230 may be attempting to detect a localized change in temperature along a portion of surface 121 above component 142-M.1 (e.g., heat from chip 196 may not affect the temperature of component 142-M.1, such that a high temperature of chip 196 may not be leveraged with as much importance by module 230 when determining whether a touch event exists above component 142-M.1 than it may be by module 230 when determining whether a touch event exists above component 142-1.1). Therefore, by leveraging the known position and temperature of other components within device 100 (e.g., through data 209 from one or more sensors 115, where the position of each sensor 115 with respect to the position of each light-generating component 142 may be accessible to system 201 (e.g., via system data of memory 104)), the effect of the temperature of other device components (e.g., within system assembly 190) may be considered in any calculation by module 230 (e.g., with respect to determining the existence and/or position of a touch event or other change in temperature along surface 121 that may be determined to be attributable to a remote object). Module 230 may zero out or otherwise factor in the effect of the temperature of device components proximate to a light-generating component 142 when leveraging the temperature of that light-generating component 142 to determine various events, such as the position of a touch event on surface 121 or the temperature of a point along surface 121.

Additionally or alternatively, if a known touch event is occurring at a first particular position PO of external surface 121 while no known touch event is occurring at a second particular position PX of external surface 121 (see, e.g., FIG. 1C), device 100 may be operative to determine that the temperature of external surface 121 at that first position PO may be associated with an external object (e.g., $T_{OBJ}$ of FIG. 1C) and that the temperature of external surface 121 at that second position PX may be more associated with the ambient temperature (e.g., $T_{AMB}$) of the external environment of device 100 that is a more general temperature not directly affected by the external object (e.g., user U). Such determination of ambient temperature $T_{AMB}$ may be included in output data 223 and leveraged by receiving element 113 in any suitable way, such as by a weather accumulating or sharing application 103 that may share such determined ambient temperature data with user U of device 100 (e.g., as a local temperature application 103) via any suitable output component of device 100 and/or store such data thereon for any other suitable local use, and/or share such data (e.g., as a crowd-sourcing weather application 103) with a remote server (e.g., server 50 via data 55) such that the local temperature determined to be ambient to device 100 (e.g., $T_{AMB}$), as may be determined by system 201 with or without any data 211, may be shared, along with any other suitable data (e.g., the location of device 100, as may be determined by any suitable component of device 100), with any other device such that other electronic devices or systems may leverage such temperature data (e.g., for crowd-sourcing temperature data across many portable electronic devices located across any suitable geographic area).

In some embodiments, when the ambient temperature $T_{AMB}$ of device 100 is received by module 230 (e.g., as data 211), such ambient temperature data may be leveraged by module 230 in combination with display temperature data 207 in any suitable way for generating any suitable output data 223 for use in any suitable way by any suitable receiving element 113. For example, when ambient temperature $T_{AMB}$ is known via data 211, module 230 may be operative to more efficiently or effectively detect a user touch event and/or $T_{OBJ}$ by comparing any determined external surface temperature data (e.g., $T_{SUR-PO}$) with that known ambient temperature $T_{AMB}$ (e.g., if the difference between the two is greater than a certain threshold, than that determined external surface temperature data may be utilized by device 100 to determine the existence of a touch event at a particular position (e.g., the position of that external surface temperature) and the position of that touch event may be leveraged by device 100, for example, without requiring any touch position data 215).

It is therefore to be appreciated that module 230 may leverage any display temperature data 207 alone or in combination with any auxiliary sensor data 209 and/or any ambient temperature data 211 and/or any thermal resistance data 213 and/or any touch position data 215 to generate any suitable output data 223 for use by any suitable receiving element 113 in any suitable manner (e.g., for altering any suitable functionality of device 100 in any suitable manner for any suitable purpose). Output data 223 may be indicative of a determined touch event on external surface 121 generally or at a particular location or locations of surface 121 for use as any suitable input by any suitable application as receiving element 113 for generating any appropriate responsive application output (e.g., any suitable adjustment of any suitable functionality of device 100 based on the parameters of that application). Output data 223 may be indicative of a determined type of temperature (e.g., $T_{OBJ}$ of an external object at surface 121 and/or $T_{AMB}$ of the ambient environment of device 100) for use by any suitable device thermal management application receiving element 113 (e.g., for adjusting a heating or cooling functionality of device 100) and/or for use by any suitable thermometer user interface application receiving element 113 (e.g., for updating a health application functionality or weather application functionality or for sharing determined external temperature information with user U or remote server 50).

Output data 223 may be indicative of the temperature profile of a particular subset or the entire array of light-generating components 142 that may be provided under any suitable portion or the entirety of external surface 121 and/or that may be indicative of the temperature profile of any portion or the entire area of external surface 121 itself, at a particular moment in time or over a length of time. Module 230 may be operative to conduct statistical analysis of each one of available display temperature data $207a$-$207z$ for each moment in time or over a certain period of time, alone or in combination with any other suitable available data (e.g., data $209a$-$209z$, 211, 213, and/or 215). This may enable device 100 to determine the temperature of any suitable external object that may touch or near touch external surface 121 (e.g., Tow of user U), the temperature of the ambient environment of device 100 (e.g., $T_{AMB}$, with or without any suitable ambient temperature data 211), the location and/or movement of any suitable touch events or near touch events along surface 121 (e.g., position PO by an external object, such as user U, with or without any suitable touch assembly position data 215), and the like. In some embodiments, device 100 may be operative to process the temperature profile of an array of light-generating components 142 and/or of external surface 121 over a length of time (e.g., over the life of device 100) in order to determine that certain portions of display assembly output component 112a have been subjected to significantly higher temperatures than other portions of display assembly output component 112a (e.g., a top right corner of display 112b has been subjected to temperatures on average over the life of device 100 that are 20° Celsius higher than has the remainder of display 112b (e.g., if that corner had been permanently positioned adjacent a window that exposes that corner to an increased amount of sunlight)), such that device 100 may be operative to alter the functionality of device 100 to account for that exposure in order to prolong the life of display 112*b* (e.g., by ramping up the brightness of the pixels of display 112*b* in that corner to compensate for any brightness depreciation that may have been caused to that corner by its exposure to additional heat as compared to other pixels of display 112*b*). This may enable real-time and/or intermittent display calibration that may be based on any suitable conditions that may be detected by device 100 (e.g., display temperature data 207 and/or any other available other data 209, 211, 213, and/or 215). For example, the current that may be injected into different light-generating components 142 (e.g., current I of FIG. 1H) may be varied amongst different light-generating components 142 based on the present or past average temperature of each light-generating component 142. For example, a light-generating component 142 that may be proximate to chip 196 (e.g., light-generating component 142-1.1) may be hotter than another light-generating component 142 that may not be proximate a hot component of device 100. Based on present or calculated average temperatures of different light-generating components 142 (e.g., by system 201), the amount of current injected into different light-generating components 142 may vary accordingly, for example, by driving hotter light-generating components 142 with a lower current than cooler light-generating components 142 (e.g., to even out their lifetimes and/or to provide constant brightness across surface 121). Spatial thermal contributions of each component of device 100 (e.g., of each component of system assembly 190) on each light-generating component 142 may be determined (e.g., during initial calibration or testing of device 100) and leveraged by system 201 during use thereof (e.g., to generate data 223 for varying current injection into one or more light-generating components 142).

In some embodiments, device 100 may be operative to process the temperature profile of an array of light-generating components 142 and/or of external surface 121 over time using the detected forward voltage of an entire row or column or of any other suitable subset or group of light-generating components (e.g., $V_{f-R}$ of FIG. 1E, $V_{f-R1}$, $V_{f-RM}$, $V_{f-C1}$, and/or $V_{f-CN}$ of FIG. 1G, etc.) in any suitable manner, which may be the same as or different than any of the above-described manners in which the detected forward voltage of one or more individual light-generating components may be used. Independent or parallel strings of light-generating components 142 may be correlated to different temperature measurements. For example, measurements of different rows and/or columns of components 142 may be cross-referenced to increase temperature sensitivity and/or to determine location of temperature at specific areas of device 100. Moreover, a particular location of a change in temperature may be determined based on a location of an intersection of two perpendicular strings of components 142 when each of those two strings is detected to exhibit a similar change. Various algorithms may be run by system 201 or otherwise by device 100 to make such a determination or other suitable determinations, such as to enable balloon action like touch sensing based on temperature sensing of one or more strings of light-generating components 142. For example, when some or all light-generating components 142 in a series are determined to be heating up, multiplication of a voltage delta can gang all such components 142 together, which may improve signal to noise characteristics of the system. If a small voltage (e.g., $V_f$) shift is detected, and there are multiple light-generating components 142 in series, device 100 may be operative to get more signal to noise on the overall series $V_f$ shift. When leveraging location information, an array of scannable light-generating components 142 in a series (e.g., a large 2-D array of light-generating components 142 in a back light unit of a display) may be provided and device 100 may be operative to determine which strings (e.g., which rows and/or columns) exhibit such a shift. As another example, progressive scan operations (e.g., row by row) may be enabled and carried out by system 201 to look at voltage shift of light-generating components 142 across entire strings (e.g., rows) as scanned such that voltage measurements at ends of strings may be accomplished in real time.

While a light-generating component 142 must be on (e.g., be driven by a current that may generate light) in order to enable determination of the temperature of that light-generating component 142, the duration and strength with which a light-generating components 142 may be driven or pulsed may be minimized to reduce the visible effect of such driving to a user (e.g., very fast and quick scanning may be utilized to provide very short pulses at low brightness (e.g., via pulse width modulation) to enable temperature determination while minimizing the amount of light emitted by device 100 to a user). Therefore, when a display is in an off or sleep mode, temperature sensing by a light-generating component 142 may be enabled by quickly and faintly driving that light-generating component 142.

As mentioned, I/O interface assembly 111*a* of device 100 may include touch assembly input component 110*a* with touch sensing assembly 124 that may be operative to receive a touch or near touch input from an object external to device 100 for interacting with other components of device 100 via wired or wireless bus 118. Such a touch assembly input component 110*a* may be used to provide input to device 100 in lieu of or in combination with other input components, such as a button (e.g., input component 110*b*), keyboard, mouse, and the like. One or more touch input components may be used for providing user input to device 100.

Touch sensing assembly 124 of touch assembly input component 110*a* may include a touch sensitive panel, which may be wholly or partially transparent, semitransparent, non-transparent, opaque, or any combination thereof. Touch assembly input component 110*a* may be embodied as a touch screen, touch pad, a touch screen functioning as a touch pad (e.g., a touch screen replacing the touchpad of a laptop), a touch screen or touch pad combined or incorporated with any other input device (e.g., a touch screen or touch pad disposed on a keyboard), or any multi-dimensional object having a touch sensitive surface for receiving touch input. In some embodiments, the terms touch screen and touch pad may be used interchangeably.

In some embodiments, touch sensing assembly 124 of touch assembly input component 110*a* embodied as a touch screen may include a transparent and/or semitransparent touch sensitive panel partially or wholly positioned over at least a portion of a display (e.g., over at least a portion of display assembly 130). In other embodiments, touch sensing assembly 124 of touch assembly input component 110*a* may be embodied as an integrated touch screen where touch sensitive components/devices are integral with display components/devices (e.g., of display assembly output component 112*a*).

Touch assembly input component 110*a* may be configured to detect the location of one or more touches or near touches based on capacitive, resistive, optical, acoustic, inductive, mechanical, chemical measurements, or any phenomena that can be measured with respect to the occurrences of the one or more touches or near touches in proximity to touch assembly input component 110*a* (e.g., in proximity to external surface 121). Software, hardware, firmware, or any combination thereof (e.g., module 230) may be used to process the measurements of the detected touches or near touches (e.g., as detected by touch position data 215 from touch assembly 124 or as detected via display temperature data 207 with or without any data 215 from touch assembly 124) to identify and track one or more gestures. A gesture may correspond to stationary or non-stationary, single or multiple, touches or near touches on touch assembly input component 110*a*. A gesture may be performed by moving one or more fingers or other objects in a particular manner with respect to touch assembly input component 110*a*, such as by tapping, pressing, rocking, scrubbing, rotating, twisting, changing orientation, pressing with varying pressure, and the like at essentially the same time, contiguously, or consecutively. A gesture may be characterized by, but is not limited to, a pinching, sliding, swiping, rotating, flexing, dragging, or tapping motion between or with any other finger or fingers. A single gesture may be performed with one or more hands, by one or more users, or any combination thereof. Through leveraging display temperature data 207, with or without touch position data 215 from dedicated touch assembly 124, system 201 may be operative to detect temperature differences between two or more detected touch events and leverage that temperature difference to differentiate between two or more sources of those detected touch events (e.g., a colder first touch event may be attributed to a first user or a first finger of a single user while a warmer second touch event may be attributed to a second user or a second finger or hand of the single user, such that the two touch events may be handled differently than if the two touch events were attributed to the same finger (e.g., the same external object)). Many receiving element applications may be operative to leverage such a distinction between detected touch event sources (e.g., as may be determinable by system 201) in any suitable way. As just one example, a video game application 103 as receiving element 113 may handle a portion of data 223 indicative of any touch events determined to be made by a first touch event source (e.g., the colder finger of a first user) as inputs by a first video game competitor and may handle a portion of data 223 indicative of any touch events determined to be made by a second touch event source (e.g., the warmer finger of a second user) as inputs by a second video game competitor, such that two users of device 100 may provide distinguishable touch events at the same time or consecutively on the same touch screen (e.g., external surface 121) for playing the video game.

Electronic device 100 may drive a display (e.g., display assembly output component 112*a*) with graphical data to display a graphical user interface ("GUI"). The GUI may be configured to receive touch input via a touch input component (e.g., via touch assembly 124 of touch assembly input component 110*a* and/or via display temperature data 207). Embodied as a touch screen (e.g., with display assembly output component 112*a* as I/O component 111*a*), touch I/O component 111*a* may display the GUI. Alternatively, the GUI may be displayed on a display (e.g., another display assembly output component 112) that may be separate from a touch input component 110. The GUI may include graphical elements displayed at particular locations within the interface. Graphical elements may include, but are not limited to, a variety of displayed virtual input devices, including virtual scroll wheels, a virtual keyboard, virtual knobs, virtual buttons, any virtual user interface ("UI"), and the like. A user may perform gestures at one or more particular locations on a touch input component 110 or display output component 112 operative to detect touch inputs (e.g., via display temperature data 207), which may be associated with the graphical elements of the GUI. In other embodiments, the user may perform gestures at one or more locations that are independent of the locations of graphical elements of the GUI. Gestures performed on a touch input component 110 or on a display output component 112 operative to detect touch inputs may directly or indirectly manipulate, control, modify, move, actuate, initiate, or generally affect graphical elements, such as cursors, icons, media files, lists, text, all or portions of images, or the like within the GUI. For instance, in the case of a touch screen, a user may directly interact with a graphical element by performing a gesture over the graphical element on the touch screen. Alternatively, a touch pad may generally provide indirect interaction. Gestures may also affect non-displayed GUI elements (e.g., causing user interfaces to appear) or may affect other actions of device 100 (e.g., affect a state or mode of a GUI, application, or operating system). Gestures may or may not be performed on a touch input component 110 or a display output component 112 in conjunction with a displayed cursor. For instance, in the case in which gestures are performed on a touchpad, a cursor (or pointer) may be displayed on a display screen or touch screen and the cursor may be controlled via touch input on the touchpad to interact with graphical objects on the display screen. In other embodiments, in which gestures are performed directly on a display screen, a user may interact directly with objects on the screen, with or without a cursor or pointer being displayed on the screen.

Feedback may be provided to the user via bus 118 in response to or based on the touch or near touches detected on a touch input component 110 or on a display output component 112 operative to detect touch inputs via display temperature data. Feedback may be transmitted optically, mechanically, electrically, olfactory, acoustically, or the like or any combination thereof and in a variable or non-variable manner.

Figure 3:
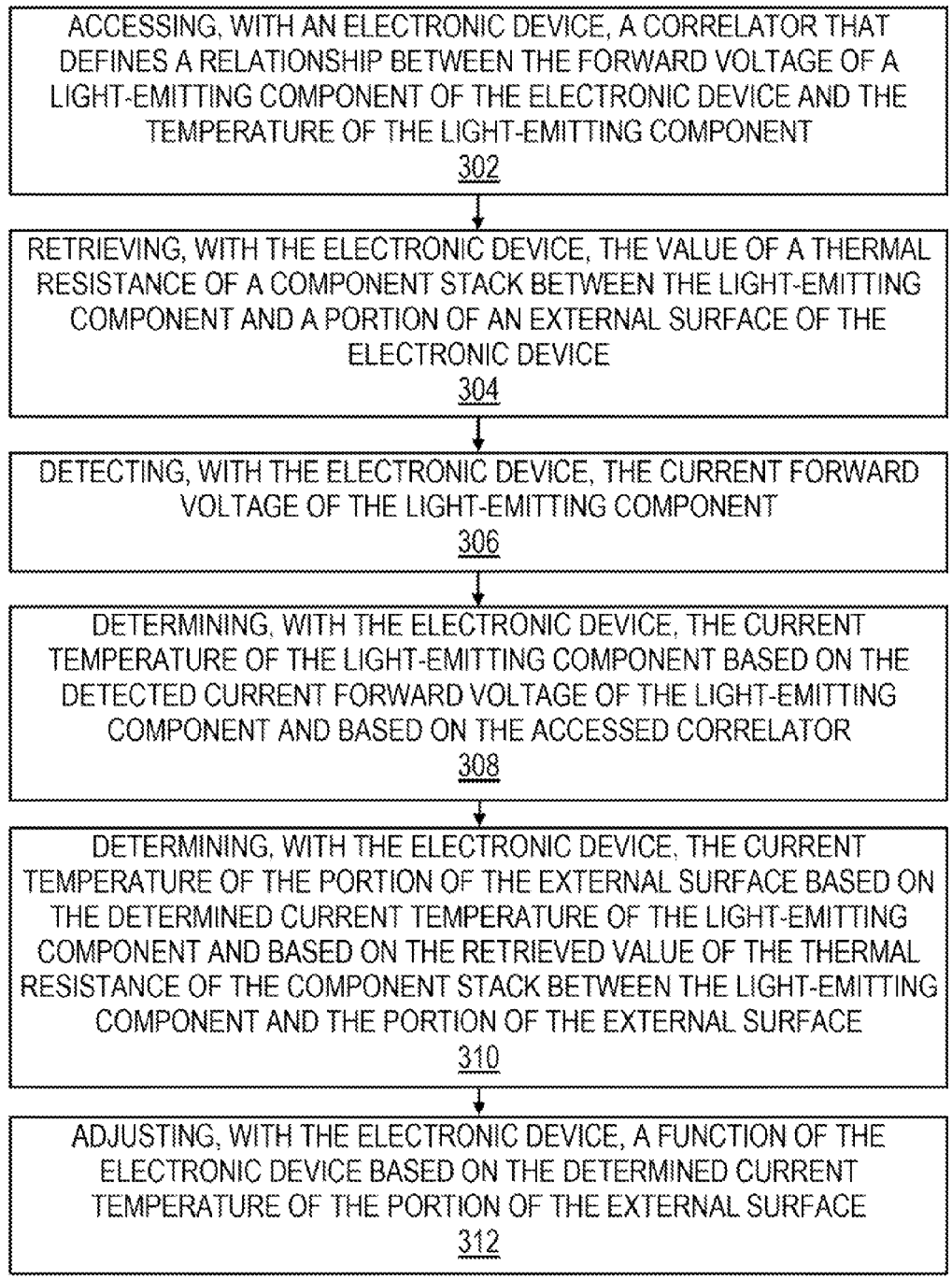

FIG. 3 is a flowchart of an illustrative process 300 for operating an electronic device, where the electronic device may include an external surface, a light-emitting component operative to emit light for illuminating the external surface, and a component stack extending between the light-emitting component and a portion of the external surface, and where the component stack may provide a thermal resistance between the light-emitting component and the portion of the external surface. At step 302 of process 300, the electronic device may access a correlator that defines a relationship between the forward voltage of the light-emitting component and the temperature of the light-emitting component. For example, as described above with respect to FIG. 2, system 201 may be configured to access correlator data 205*a* (e.g., correlator CL-a) that may define a relationship between the forward voltage of light-generating component 142-*a* and the temperature of light-generating component 142-*a*. Next, at step 304 of process 300, the electronic device may retrieve the value of the thermal resistance of the component stack between the light-emitting component and the portion of the external surface. For example, as described above with respect to FIG. 2, system 201 may be configured to retrieve thermal resistance data 215 that may be indicative of the value of the thermal resistance of a component stack between light-generating component 142-*a* and an external surface of the electronic device (e.g., thermal resistance $R_{TH-LCS}$ of stack 128 between light-generating component 142 and external surface 121 of device 100 of FIG. 1C). Next, at step 306 of process 300, the electronic device may detect the current forward voltage of the light-emitting component. For example, as described above with respect to FIG. 2, system 201 may be configured to detect forward voltage data 203a (e.g., $V_{f-a}$) of light-generating component 142-a (e.g., forward voltage $V_f$ of light-generating component 142 of FIGS. 1C and 1H). Next, at step 308 of process 300, the electronic device may determine the current temperature of the light-emitting component based on the detected current forward voltage of the light-emitting component and based on the accessed correlator. For example, as described above with respect to FIG. 2, system 201 may be configured to determine current temperature data 207a (e.g., $T_{j-a}$) of light-generating component 142-a based on voltage data 203a and correlator data 205a (e.g., temperature $T_j$ of light-generating component 142 of FIGS. 1C and 1H). Next, at step 310 of process 300, the electronic device may determine the current temperature of the portion of the external surface based on the determined current temperature of the light-emitting component and based on the retrieved value of the thermal resistance of the component stack between the light-emitting component and the portion of the external surface. For example, as described above with respect to FIG. 2, system 201 may be configured to determine the current temperature at a portion of external surface 121 (e.g., as a portion of output data 223) based on current temperature data 207a (e.g., $T_{j-a}$) of light-generating component 142-a and based on the retrieved thermal resistance data 215 that may be indicative of the value of the thermal resistance of a component stack between light-generating component 142-a and external surface 121. Next, at step 312 of process 300, the electronic device may adjust a function of the electronic device based on the determined current temperature of the portion of the external surface. For example, as described above with respect to FIG. 2, output data 223 of system 201 may be of any suitable use by any suitable receiving element 113 (e.g., an active application 103 of device 100) for adjusting any suitable functionality of device 100 (e.g., for performing an adjustment 113a of a functionality of device 100).

It is understood that the steps shown in process 300 of FIG. 3 are merely illustrative and that existing steps may be modified or omitted, additional steps may be added, and the order of certain steps may be altered.

Figure 4:
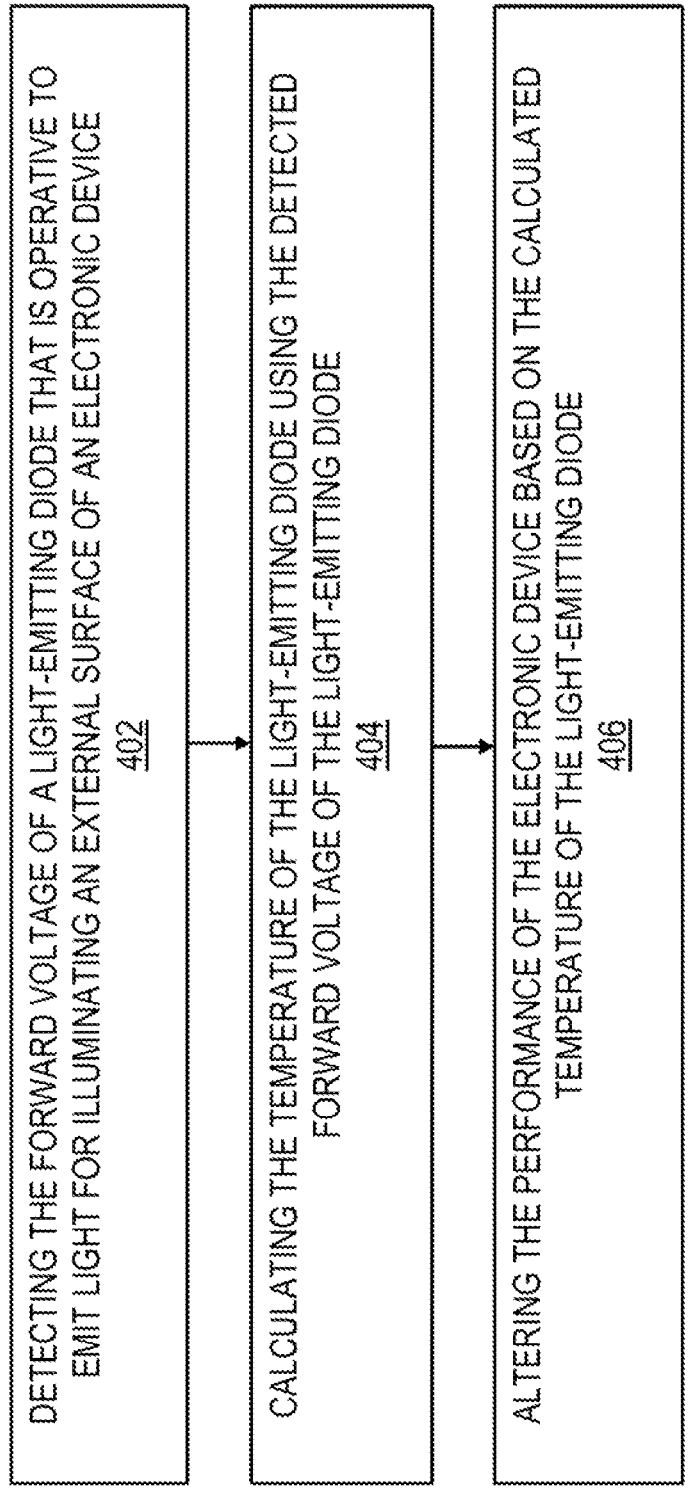

FIG. 4 is a flowchart of an illustrative process 400 for operating an electronic device that may include an external surface and a light-emitting diode operative to emit light for illuminating the external surface. At step 402 of process 400, the forward voltage of the light-emitting diode may be detected. For example, as described above with respect to FIG. 2, system 201 may be configured to detect forward voltage data 203a (e.g., $V_{f-a}$) of light-generating component 142-a (e.g., forward voltage $V_f$ of light-generating component 142 of FIGS. 1C and 1H). Next, at step 404 of process 400, the temperature of the light-emitting diode may be calculated using the detected forward voltage of the light-emitting diode. For example, as described above with respect to FIG. 2, system 201 may be configured to determine current temperature data 207a (e.g., $T_{j-a}$) of light-generating component 142-a based on voltage data 203a. Next, at step 406 of process 400, the performance of the electronic device may be altered based on the calculated temperature of the light-emitting diode. For example, as described above with respect to FIG. 2, output data 223 of system 201 may generated based on current temperature data 207a and used by any suitable receiving element 113 (e.g., an active application 103 of device 100) for adjusting any suitable functionality of device 100 (e.g., for performing an adjustment 113a of a functionality of device 100).

It is understood that the steps shown in process 400 of FIG. 4 are merely illustrative and that existing steps may be modified or omitted, additional steps may be added, and the order of certain steps may be altered.

FIG. 5 is a flowchart of an illustrative process 500 for operating an electronic device that may include an external surface and a light-emitting diode operative to emit light through the external surface. At step 502 of process 500, the temperature of a portion of the external surface may be calculated using a forward voltage of the light-emitting diode. For example, as described above with respect to FIG. 2, system 201 may be configured to determine temperature $T_{SUR-PO}$ of portion PO of external surface 121 of device 100 using current temperature $T_j$ of light-generating component 142, which may be determined using forward voltage $V_f$ of light-generating component 142. Next, at step 504 of process 500, the performance of the electronic device may be altered based on the calculated temperature of the portion of the external surface. For example, as described above with respect to FIG. 2, output data 223 of system 201 may generated based on a determined temperature of at least a portion of external surface 121 and used by any suitable receiving element 113 (e.g., an active application 103 of device 100) for adjusting any suitable functionality of device 100 (e.g., for performing an adjustment 113a of a functionality of device 100).

It is understood that the steps shown in process 500 of FIG. 5 are merely illustrative and that existing steps may be modified or omitted, additional steps may be added, and the order of certain steps may be altered.

FIG. 6 is a flowchart of an illustrative process 600 for operating an electronic device that may include an external surface and a number of light-emitting diodes operative to emit light through the external surface. At step 602 of process 600, the temperature of each portion of a number of portions of the external surface may be calculated using a forward voltage of a respective light-emitting diode of the number of light-emitting diodes. For example, as described above with respect to FIG. 2, system 201 may be configured to determine temperature $T_{SUR-PO1}$ of portion PO-1 of external surface 121 of device 100 of FIGS. 1D and 1E using current temperature $T_{j-1}$ of light-generating component 142-1, which may be determined using forward voltage $V_{f-1}$ of light-generating component 142-1, to determine temperature $T_{SUR-PO2}$ of portion PO-2 of external surface 121 of device 100 of FIGS. 1D and 1E using the current temperature of light-generating component 142-2, which may be determined using forward voltage $V_{f-2}$ of light-generating component 142-2, and the like for any subset or all of light-generating components 142-1 through 142-N. Next, at step 604 of process 600, the position of a touch event on the external surface of the electronic device may be determined using the calculated temperatures. For example, as described above with respect to FIG. 2, system 201 may be configured to determine position PO-1 on external surface 121 as the position of a touch event by user U based on the determined temperature of various portions of external surface 121.

It is understood that the steps shown in process 600 of FIG. 6 are merely illustrative and that existing steps may be modified or omitted, additional steps may be added, and the order of certain steps may be altered.

One, some, or all of the processes described with respect to FIGS. 1-6 may each be implemented by software, but may also be implemented in hardware, firmware, or any combination of software, hardware, and firmware. Instructions for performing these processes may also be embodied as machine- or computer-readable code recorded on a machine- or computer-readable medium. In some embodiments, the computer-readable medium may be a non-transitory computer-readable medium. Examples of such a non-transitory computer-readable medium include but are not limited to a read-only memory, a random-access memory, a flash memory, a compact disc (e.g., compact disc ("CD")-ROM), a digital versatile disk ("DVD"), a magnetic tape, a removable memory card, and a data storage device (e.g., memory 104 of FIG. 1). In other embodiments, the computer-readable medium may be a transitory computer-readable medium. In such embodiments, the transitory computer-readable medium can be distributed over network-coupled computer systems so that the computer-readable code is stored and executed in a distributed fashion. For example, such a transitory computer-readable medium may be communicated from one electronic device to another electronic device using any suitable communications protocol (e.g., the computer-readable medium may be communicated from a remote device or server 50 as data 55 to electronic device 100 via communications component 106 (e.g., as at least a portion of an application 103). Such a transitory computer-readable medium may embody computer-readable code, instructions, data structures, program modules, or other data in a modulated data signal, such as a carrier wave or other transport mechanism, and may include any information delivery media. A modulated data signal may be a signal that has one or more of its characteristics set or changed in such a manner as to encode information in the signal.

It is to be understood that any, each, or at least one module or component or element or subsystem of device 100 (e.g., of system 201) may be provided as a software construct, firmware construct, one or more hardware components, or a combination thereof. For example, any, each, or at least one module or component or element or subsystem of device 100 (e.g., of system 201) may be described in the general context of computer-executable instructions, such as program modules, that may be executed by one or more computers or other devices. Generally, a program module may include one or more routines, programs, objects, components, and/or data structures that may perform one or more particular tasks or that may implement one or more particular abstract data types. It is also to be understood that the number, configuration, functionality, and interconnection of the modules and components and elements and subsystems of device 100 (e.g., of system 201) are merely illustrative, and that the number, configuration, functionality, and interconnection of existing modules, components, elements, and/or subsystems of device 100 (e.g., of system 201) may be modified or omitted, additional modules, components, elements, and/or subsystems of device 100 (e.g., of system 201) may be added, and the interconnection of certain modules, components, elements, and/or subsystems of device 100 (e.g., of system 201) may be altered.

At least a portion of one or more of the modules or components or elements or subsystems of device 100 may be stored in or otherwise accessible to an entity of system 1 in any suitable manner (e.g., in memory 104 of device 100 (e.g., as at least a portion of an application 103). For example, any or each module of system 201 may be implemented using any suitable technologies (e.g., as one or more integrated circuit devices), and different modules may or may not be identical in structure, capabilities, and operation. Any or all of the modules or other components of device 100 may be mounted on an expansion card, mounted directly on a system motherboard, or integrated into a system chipset component (e.g., into a "north bridge" chip).

Any or each module or component of device 100 may be a dedicated system implemented using one or more expansion cards adapted for various bus standards. For example, all of the modules may be mounted on different interconnected expansion cards or all of the modules may be mounted on one expansion card. With respect to system 201, by way of example only, any one or more of the modules of system 201 may interface with a motherboard or processor 102 of device 100 through an expansion slot (e.g., a peripheral component interconnect ("PCI") slot or a PCI express slot). Alternatively, any one or more of the modules of system 201 need not be removable but may include one or more dedicated modules that may include memory (e.g., RAM) dedicated to the utilization of the module. In other embodiments, any one or more of the modules of system 201 may be integrated into device 100. For example, a module of system 201 and/or any intelligence that may be associated with one or more of components 113, 115, 117, and/or 124 may utilize a portion of device memory 104 of device 100. Any or each element or module or component of device 100 (e.g., any or each module of system 201 and/or element 113) may include its own processing circuitry and/or memory. Alternatively, any or each module or component of device 100 (e.g., any or each module of system 201 and/or element 113) may share processing circuitry and/or memory with any other module of system 201 and/or element 113 and/or processor 102 and/or memory 104 of device 100.

While there have been described systems, methods, and computer-readable media for determining the temperature of a light-generating component of a display assembly using a voltage of the light-generating component, it is to be understood that many changes may be made therein without departing from the spirit and scope of the subject matter described herein in any way. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

Therefore, those skilled in the art will appreciate that the concepts of the disclosure can be practiced by other than the described embodiments, which are presented for purposes of illustration rather than of limitation.

What is claimed is:
1. An electronic device comprising:
    a display assembly comprising:
        an external display surface;
        a light-emitting diode operative to emit light for illuminating the external display surface; and
        a component stack extending between the light-emitting diode and a portion of the external display surface, wherein the component stack provides a thermal resistance between the light-emitting diode and the portion of the external display surface; and
    a sensor management system operative to:
        access a correlator that defines a relationship between the forward voltage of the light-emitting diode and the temperature of the light-emitting diode;
        access the value of the thermal resistance of the component stack between the light-emitting diode and the portion of the external display surface;
        detect the current forward voltage of the light-emitting diode;

determine the current temperature of the light-emitting diode based on the detected current forward voltage of the light-emitting diode and based on the accessed correlator; and determine the current temperature of the portion of the external display surface based on the determined current temperature of the light-emitting diode and based on the accessed value of the thermal resistance of the component stack between the light-emitting diode and the portion of the external display surface.

2. The electronic device of claim 1, wherein the component stack comprises at least a portion of a layer of cover glass that defines at least the portion of the external display surface.

3. The electronic device of claim 1, wherein the component stack comprises at least a portion of a matrix of thin-film transistors.

4. The electronic device of claim 1, wherein the component stack comprises at least a portion of a touch subassembly that is operative to detect the position of a user touch event on the external display surface.

5. The electronic device of claim 1, wherein the electronic device is operative to detect a user touch event on the external display surface based on the determined current temperature of the portion of the external display surface.

6. The electronic device of claim 1, wherein the sensor management system is further operative to perform an adjustment of a functionality of the electronic device based on the determined current temperature of the portion of the external display surface.

7. The electronic device of claim 6, further comprising a housing that at least partially encloses the display assembly and a temperature sensor, wherein the sensor management system is operative to perform the adjustment of the functionality of the electronic device based on the determined current temperature of the portion of the external display surface and based on an output of the temperature sensor indicative of a temperature within the housing.

8. The electronic device of claim 6, further comprising a communications component operative to receive ambient temperature data indicative of the temperature of the environment of the electronic device from a remote data source, wherein the sensor management system is operative to perform the adjustment of the functionality of the electronic device based on the determined current temperature of the portion of the external display surface and based on the received ambient temperature data.

9. The electronic device of claim 6, further comprising a touch component operative to detect the current position of a user touch event on the external display surface, wherein the sensor management system is operative to perform the adjustment of the functionality of the electronic device based on the determined current temperature of the portion of the external display surface and based on the detected current position of the user touch event on the external display surface.

10. The electronic device of claim 6, wherein:
the electronic device is operative to detect a user touch event on the external display surface based on the determined current temperature of the portion of the external display surface; and
the sensor management system is operative to perform the adjustment of the functionality of the electronic device based on the detected user touch event.

11. The electronic device of claim 6, wherein the adjustment comprises one of:

enabling a disabled component of the electronic device; and
disabling an enabled component of the electronic device.

12. The electronic device of claim 6, wherein the adjustment comprises presenting new information to a user of the electronic device.

13. The electronic device of claim 1, wherein:
the display assembly comprises a plurality of light-emitting diodes;
the plurality of light-emitting diodes comprises the light-emitting diode;
the external display surface comprises a plurality of external display surface portions;
the plurality of external display surface portions comprises the portion of the external display surface;
the component stack comprises a plurality of component stack portions;
each component stack portion of the plurality of component stack portions extends between a respective light-emitting diode of the plurality of light-emitting diodes and a respective external display surface portion of the plurality of external display surface portions; and
for each particular light-emitting diode of the plurality of light-emitting diodes, the sensor management system is operative to:
access a particular correlator that defines a relationship between the forward voltage of the particular light-emitting diode and the temperature of the particular light-emitting diode;
access the value of the thermal resistance provided by a particular component stack portion of the plurality of component stack portions that extends between the particular light-emitting diode and a particular external display surface portion of the plurality of external display surface portions;
detect the current forward voltage of the particular light-emitting diode;
determine the current temperature of the particular light-emitting diode based on the detected current forward voltage of the particular light-emitting diode and based on the accessed particular correlator; and
determine the current temperature of the particular external display surface portion based on the determined current temperature of the particular light-emitting diode and based on the accessed value of the thermal resistance of the particular component stack portion.

14. The electronic device of claim 13, wherein the electronic device is operative to detect a user touch event on the external display surface based on the determined current temperature of each particular external display surface portion.

15. The electronic device of claim 13, wherein the electronic device is operative to detect the position of a user touch event on the external display surface based on the determined current temperature of each particular external display surface portion.

16. The electronic device of claim 13, wherein:
the display assembly further comprises a back light unit; and
each light-emitting diode of the plurality of light-emitting diodes is operative to emit light into the back light unit.

17. The electronic device of claim 16, wherein the display assembly is a liquid crystal display assembly.

18. The electronic device of claim 13, wherein the plurality of light-emitting diodes is arranged as an array of rows and columns of light-emitting diodes extending underneath the external display surface.

19. The electronic device of claim 18, wherein the display assembly is one of an organic light-emitting diode display assembly and a micro-light-emitting diode display assembly.

20. The electronic device of claim 13, wherein the sensor management system is further operative to perform an adjustment of a functionality of the electronic device based on the determined current temperature of each particular external display surface portion.

21. A method for operating an electronic device that comprises an external surface, a light-emitting component operative to emit light for illuminating the external surface, and a component stack extending between the light-emitting component and a portion of the external surface, wherein the component stack provides a thermal resistance between the light-emitting component and the portion of the external surface, the method comprising:
    accessing, with the electronic device, a correlator that defines a relationship between the forward voltage of the light-emitting component and the temperature of the light-emitting component;
    retrieving, with the electronic device, the value of the thermal resistance of the component stack between the light-emitting component and the portion of the external surface;
    detecting, with the electronic device, the current forward voltage of the light-emitting component;
    determining, with the electronic device, the current temperature of the light-emitting component based on the detected current forward voltage of the light-emitting component and based on the accessed correlator;
    determining, with the electronic device, the current temperature of the portion of the external surface based on the determined current temperature of the light-emitting component and based on the retrieved value of the thermal resistance of the component stack between the light-emitting component and the portion of the external surface; and
    adjusting, with the electronic device, a function of the electronic device based on the determined current temperature of the portion of the external surface.

22. The method of claim 21, further comprising, determining, with the electronic device, the existence of a touch event on the external surface based on the determined current temperature of the portion of the external surface.

23. The method of claim 21, further comprising, determining, with the electronic device, the position of a touch event on the external surface based on the determined current temperature of the portion of the external surface.

24. The method of claim 21, further comprising, determining, with the electronic device, an ambient temperature of an environment external to the electronic device based on the determined current temperature of the portion of the external surface.

25. The method of claim 21, further comprising, determining, with the electronic device, a temperature of an object external to the electronic device based on the determined current temperature of the portion of the external surface.

26. The method of claim 21, wherein the adjusting the function comprises throttling at least one component of the electronic device.

27. The method of claim 21, wherein the adjusting the function comprises communicating temperature information to an entity external to the electronic device.

28. A non-transitory computer-readable medium for controlling an electronic device that comprises an external surface, a light-emitting component operative to emit light for illuminating the external surface, and a component stack extending between the light-emitting component and a portion of the external surface, wherein the component stack provides a thermal resistance between the light-emitting component and the portion of the external surface, the non-transitory computer-readable medium comprising computer-readable instructions recorded thereon for:
    accessing, with the electronic device, a correlator that defines a relationship between the forward voltage of the light-emitting component and the temperature of the light-emitting component;
    retrieving, with the electronic device, the value of the thermal resistance of the component stack between the light-emitting component and the portion of the external surface;
    detecting, with the electronic device, the current forward voltage of the light-emitting component;
    determining, with the electronic device, the current temperature of the light-emitting component based on the detected current forward voltage of the light-emitting component and based on the accessed correlator;
    determining, with the electronic device, the current temperature of the portion of the external surface based on the determined current temperature of the light-emitting component and based on the retrieved value of the thermal resistance of the component stack between the light-emitting component and the portion of the external surface; and
    adjusting, with the electronic device, a functionality of the electronic device based on the determined current temperature of the portion of the external surface.

* * * * *